(12) United States Patent
Sakai et al.

(10) Patent No.: US 8,325,946 B2
(45) Date of Patent: Dec. 4, 2012

(54) INPUT SELECTOR

(75) Inventors: Mitsuteru Sakai, Kyoto (JP); Moto Yamada, Kyoto (JP); Takahiro Ogi, Kyoto (JP); Yosuke Sato, Kyoto (JP); Makoto Nakamura, Kyoto (JP)

(73) Assignee: Rohm Co., Ltd. (JP)

( * ) Notice: Subject to any disclaimer, the term of this patent is extended or adjusted under 35 U.S.C. 154(b) by 268 days.

(21) Appl. No.: 12/702,414

(22) Filed: Feb. 9, 2010

(65) Prior Publication Data

US 2010/0220874 A1 Sep. 2, 2010

(30) Foreign Application Priority Data

| Feb. 9, 2009 | (JP) | 2009-027889 |
| Feb. 10, 2009 | (JP) | 2009-028415 |
| Feb. 27, 2009 | (JP) | 2009-045286 |
| Mar. 25, 2009 | (JP) | 2009-074975 |
| Dec. 21, 2009 | (JP) | 2009-289555 |

(51) Int. Cl.
*H03F 99/00* (2009.01)
*H02B 1/00* (2006.01)

(52) U.S. Cl. ........................ 381/120; 381/123

(58) Field of Classification Search .................. 381/120, 381/123, 56, 58, 77, 118, 119, 28; 369/1, 369/2, 4, 47.24, 47.16, 337, 339; 330/252; 327/407

See application file for complete search history.

(56) References Cited

U.S. PATENT DOCUMENTS

| 4,755,765 A * | 7/1988 | Ferland ......................... 330/252 |
| 5,262,735 A * | 11/1993 | Hashimoto et al. .............. 331/45 |
| 6,473,135 B1 * | 10/2002 | Iwamura ........................ 348/706 |
| 6,519,416 B1 * | 2/2003 | Choi et al. ........................ 386/228 |
| 7,043,034 B2 * | 5/2006 | Poling et al. .................... 381/123 |
| 7,990,822 B2 * | 8/2011 | Tanaka et al. ............... 369/47.16 |
| 2004/0088064 A1 * | 5/2004 | Endo ................................. 700/94 |
| 2005/0207594 A1 * | 9/2005 | Uehara et al. .................. 381/104 |
| 2005/0220195 A1 * | 10/2005 | Shimizu ........................ 375/257 |
| 2006/0291665 A1 * | 12/2006 | Tsuiki et al. ...................... 381/17 |
| 2007/0285054 A1 * | 12/2007 | Li et al. .......................... 320/116 |
| 2009/0045787 A1 * | 2/2009 | Takeuchi ........................ 323/273 |

FOREIGN PATENT DOCUMENTS

| JP | 5-72267 A | 3/1993 |
| JP | 7-263988 A | 10/1995 |
| JP | 11-340759 A | 12/1999 |
| JP | 2004-222077 A | 8/2004 |
| JP | 2005-117489 A | 4/2005 |
| JP | 2005-217710 A | 8/2005 |

\* cited by examiner

*Primary Examiner* — Hai Phan

(74) *Attorney, Agent, or Firm* — Cantor Colburn LLP

(57) ABSTRACT

A first selector receives a second input signal and a second reference voltage, and selects either one. A first buffer receives the output signal of the first selector, and outputs the signal thus received to a terminal of the first resistor, and to a terminal of the third resistor. A second selector receives a first input signal and a third input signal, and selects either one. A fourth selector receives, as input signals, the output signal of an operational amplifier, a signal that corresponds to the output signal of the second selector, and a signal that corresponds to the second input signal, and selects one signal selected from among the signals thus received.

11 Claims, 20 Drawing Sheets

10a

INPUT SELECTOR

BACKGROUND OF THE INVENTION

1. Field of the Invention

The present invention relates to an input selector which supports various kinds of signal input formats, and selects either one signal input format.

2. Description of the Related Art

As a method for transmitting a signal, single-ended transmission, differential transmission, ground isolation transmission, or the like is employed. FIG. 1 is a circuit diagram which shows a configuration of an ordinary input selector configured to receive various kinds of signals. A differential signal pair is input via input ports Pi1 and Pi2. A single-ended signal is input via input ports Pi3 and Pi4. A ground isolation signal is input via input ports Pi5 and Pi6. An input selector 300 includes a reception circuit 302 for a differential signal, a reception circuit 304 for a single-ended signal, a reception circuit 306 for a ground isolation signal, and a selector 308. The reception circuits 302 and 306 respectively convert a differential signal and a ground isolation signal into single-ended signals. The selector 308 receives output signals from these three reception circuits 302, 304, and 306, and outputs any one of these signals.

RELATED ART DOCUMENTS

Patent Documents

[Patent Document 1]
Japanese Patent Application Laid Open No. H5-72267

In a case in which an input selector 300 as shown in FIG. 1 has been designed, the signals which can be received are limited to only: one signal received via a differential signal line, two signals received via two single-ended signal lines, and one signal received via one ground isolation signal line. That is to say, other signal combinations cannot be received. For example, in a case in which the user desires to receive a signal from another differential signal line, the reception circuit 304 must be replaced with the reception circuit 302.

That is to say, once the designer of the electronic device employing the input selector 300 shown in FIG. 1 has decided upon a combination of input formats, the combination of input formats cannot be modified. If the designer modifies the combination of input formats, the designer must replace an unnecessary input selector with a suitable input selector that corresponds to the desired new combination. This lowers the degree of freedom in the design of the input selector.

From another point of view, the manufacturer of the input selector must design such an input selector according to the demands of designers of electronic devices.

SUMMARY OF THE INVENTION

The present invention has been made in order to solve such a problem. Accordingly, it is an exemplary purpose of the present invention to provide a highly versatile input selector which can be flexibly applied to various signal input formats.

1. An embodiment of the present invention relates to an input selector. The input selector comprises: a first input port and a second input port configured to receive a first input signal and a second input signal, respectively; a first resistor arranged such that one terminal thereof is connected to the first input port; a second resistor arranged such that one terminal thereof is connected to the second input port, and such that a first reference voltage is applied to the other terminal thereof; a first selector configured to receive the second input signal and a second reference voltage, and to select one from among the input signals thus received; a first buffer configured to receive an output signal of the first selector, and to output the signal thus received to the other terminal of the first resistor; and an output circuit having a first input terminal, a second input terminal, and an output terminal, and configured to be capable of switching the state between at least one state selected from among a state in which a signal received via the first input terminal is output and a state in which a signal received via the second input terminal is output, and a state in which a signal is output according to the difference between the signal received via the first input terminal and the signal received via the second input terminal. The output circuit receives the first input signal via the first input terminal, and receives the second input signal via the second input terminal.

By switching a combination of the states of the first selector and the output circuit, such an embodiment is capable of receiving a single-ended signal, a differential signal, and a ground isolation signal.

Also, an input selector according to an embodiment may further comprise: a third input port configured to receive a third input signal; a third resistor arranged such that one terminal thereof is connected to the third input port; and a second selector configured to receive the first input signal and the third input signal, and to select one from among the input signals thus received. Also, the output circuit may receive an output signal of the second selector via the first input terminal thereof, and may receive the second input signal via the second input terminal thereof.

By switching a combination of the states of the first selector, the second selector, and the output circuit, such an embodiment is capable of receiving a single-ended signal, a differential signal, and a grand isolation signal via the first through third input ports.

Also, an input selector according to an embodiment may further comprise a third selector arranged on a path provided from the second input port to the second input terminal of the output circuit, and configured to receive the second input signal via an input terminal thereof. Also, the output circuit may receive, via the second terminal thereof, the second input signal transmitted via the third selector.

With such an arrangement, the impedance of the path that passes through the second selector can be set to the same as that of the path that passes through the third selector. Thus, such an arrangement provides reduced waveform distortion as compared with an arrangement which does not include such a third selector.

Also, an input selector according to an embodiment may further comprise: a fourth input port configured to receive a fourth input signal; and a fourth resistor arranged such that one terminal thereof is connected to the fourth input port, and such that a third reference voltage is applied to the other terminal thereof. Also, the first selector may receive the fourth input signal, in addition to the second input signal and the second reference voltage. Also, the third selector may receive the fourth input signal, in addition to the second input signal.

By switching a combination of the states of the first through third selectors and the output circuit, such an embodiment is capable of receiving a single-ended signal, a differential signal, and a grand isolation signal via the first through fourth input ports.

Also, the first selector may receive a signal that corresponds to the output signal of the third selector, instead of the second input signal and the fourth input signal. Such an arrangement provides a simple circuit configuration.

Also, the output circuit may comprise: an operational amplifier having two input terminals and an output terminal; a first output resistor arranged such that one terminal thereof is connected to one input terminal of the operational amplifier, and such that a signal that corresponds to the signal input via the first input terminal of the output circuit is received via the other terminal thereof; a second output resistor arranged such that one terminal thereof is connected to the aforementioned one input terminal of the operational amplifier, and such that a fourth reference voltage is applied to the other terminal thereof; a third output resistor arranged such that one terminal thereof is connected to the other terminal of the operational amplifier, and such that a signal that corresponds to the signal input via the second input terminal of the output circuit is received via the other terminal thereof; a fourth output resistor arranged such that one terminal thereof is connected to the other input terminal of the operational amplifier, and such that the other terminal thereof is connected to the output terminal of the operational amplifier; and a fourth selector configured to receive an output signal of the operational amplifier, a signal that corresponds to the signal input via the first input terminal of the output circuit, and a signal that corresponds to the signal input via the second input terminal of the output circuit, and to select one signal from among the input signals thus received.

Also, the output circuit may comprise: an operational amplifier having two input terminals and an output terminal; a fifth selector having two input terminals, and arranged such that an output terminal thereof is connected to one input terminal of the operational amplifier; a sixth selector having two input terminals, and arranged such that one terminal thereof, i.e., a first input terminal thereof is connected to the output terminal of the operational amplifier, and such that the output terminal thereof is connected to the other input terminal of the operational amplifier; a first output resistor arranged such that one terminal thereof is connected to the first input terminal of the fifth selector, and such that a signal that corresponds to the signal input via the first input terminal of the output circuit is received via the other terminal thereof; a second output resistor arranged such that one terminal thereof is connected to the first input terminal of the fifth selector, and such that a fourth reference voltage is applied to the other terminal thereof; a third output resistor arranged such that one terminal thereof is connected to a second input terminal of the sixth selector, and such that a signal that corresponds to the signal input via the second input terminal of the output circuit is received via the other terminal thereof; and a fourth output resistor arranged such that one terminal thereof is connected to the second input terminal of the sixth selector, and such that the other terminal thereof is connected to the output terminal of the operational amplifier.

Also, the output circuit may further comprise: a second buffer arranged on a path provided from the first input terminal of the output circuit to the aforementioned other terminal of the first output resistor; and a third buffer arranged on a path provided from the second input terminal of the output circuit to the aforementioned other terminal of the third output resistor.

Another embodiment of the present invention also relates to an input selector. The input selector may comprise two sets of the input selectors according to any one of the above-described embodiments. With such an embodiment including two sets of the input selectors, an application can be made which supports two channels of, i.e., the left and right channels of stereo audio signals, for example.

Also, two sets of the above-described input selectors may be provided. Also, the first selector on one input selector side may receive, as an input signal, the output signal of the first selector on the other input selector side, in addition to the second input signal, the second reference voltage, and the fourth input signal. Such an arrangement is capable of supporting more varied combinations of signal input formats.

2. An embodiment of the present invention relates to a signal processing circuit comprising n (n is an integer which is equal to or greater than 2) processing blocks connected in cascade, and configured such that each processing block performs predetermined signal processing on an output signal received from an upstream processing block, and to output the signal thus processed to a downstream processing block. The signal processing circuit comprises: a bypass line configured to bypass the i-th (i is a predetermined integer which satisfies the relation $1 \leq i \leq n$) processing block through the j-th (j is a predetermined integer which satisfies the relation $i < j \leq n$) processing block; and a soft switch circuit including at least two input terminals and one output terminal, and configured to receive the output signal of the j-th processing block via the first input terminal thereof, to receive the input signal of the i-th processing block via the second input terminal thereof, to select and output one from among the two signals, and to softly switch the output thereof from an input signal input via one input terminal to another input signal input via the other input terminal when the signal is switched.

By instructing the soft switch circuit to select a signal on the second input terminal side, such an embodiment is capable of bypassing the i-th through j-th processing blocks, thereby suppressing signal degradation. Furthermore, the soft switch circuit is capable of softly switching the output signal from a signal input via one input terminal to another signal input via the other input terminal, thereby reducing noise that occurs when the bypass line is switched.

Also, a signal processing circuit according to an embodiment may further comprise a control unit configured to control the state of the soft switch circuit. Also, the control circuit may monitor setting data which defines signal processing to be executed by each of the n processing blocks. Also, when all the setting data for the i-th through j-th processing blocks is set to values that have no effect on a signal to be processed, the control unit may instruct the soft switch circuit to select a signal input via the second input terminal. Also, when at least one of the setting data for the i-th through j-th processing blocks is set to a value that has an effect on a signal to be processed, the control unit may instruct the soft switch circuit to select a signal input via the first input terminal.

Such an arrangement allows the designer to design a set mounting such a signal processing circuit without concern for the control operation of the soft switch circuit included in the signal processing circuit, thereby reducing the burdens on the design.

Also, a signal processing circuit according to an embodiment may further comprise a control unit configured to control the state of the soft switch circuit. Also, the control unit may receive, from an external circuit, a control signal which designates the state of the soft switch circuit, and may control the soft switch circuit according to the control signal.

Such an arrangement enables the soft switch circuit to be controlled independent of the states of the processing blocks.

Also, the signal processing circuit may be a circuit configured to perform signal processing on an audio signal. Also, one of the i-th through j-th processing blocks may be a tone control circuit configured to amplify or attenuate a predetermined frequency component.

Also, the signal processing circuit may be a circuit configured to perform signal processing on an audio signal. Also, one of the i-th through j-th processing blocks may be a loudness circuit configured to enhance the bass range.

Also, the signal processing circuit may be a circuit configured to perform signal processing on an audio signal. Also, one of the i-th through j-th processing blocks may be a high-pass filter configured to remove a frequency component to be generated at a subwoofer.

Also, the signal processing circuit may be a circuit configured to perform signal processing on an audio signal. Also, one of the i-th through j-th processing blocks may be a bass boost circuit configured to enhance the bass range.

Also, the signal processing circuit may be a circuit configured to perform signal processing on an audio signal. Also, the (i−1)-th processing block may be a volume circuit configured to amplify the audio signal with a gain that corresponds to the user's setting value. Also, the (j+1)-th processing block may be a power amplifier configured to amplify the audio signal, and to output the audio signal thus amplified to an electroacoustic conversion element.

Such an arrangement is capable of performing the minimum necessary processing on an audio signal by bypassing the i-th processing block through the j-th processing block, thereby suppressing signal degradation while reproducing the audio signal.

Another embodiment of the present invention relates to an audio system. The audio system comprises: an audio signal source configured to generate an audio signal; a signal processing circuit according to any one of the above-described embodiments, configured to perform predetermined signal processing on the audio signal; and an electroacoustic conversion element configured to be driven by the audio signal processed by the signal processing circuit.

3. An embodiment of the present invention relates to an audio signal processing circuit configured to perform signal processing on an audio signal received via an input port, and to output the audio signal thus processed via an output port. The audio signal processing circuit comprises: a filter configured to perform filtering of the audio signal; a variable gain amplifier configured to amplify or attenuate the audio signal with a gain set beforehand; and a matrix switch connected to the input port, the output port, the input terminal and the output terminal of the filter, and the input terminal and the output terminal of the variable gain amplifier. The matrix switch circuit is configured to be capable of switching the state between a first state in which the input port, the variable gain amplifier, the filter, and the output port are connected in this order, and a second state in which the input port, the filter, the variable gain amplifier, and the output port are connected in this order.

With such an embodiment, the sequencing of the filter and the variable gain amplifier can be switched as desired. Thus, such an arrangement is capable of attenuating the noise that occurs at the filter by means of the variable gain amplifier. Conversely, such an arrangement is capable of cutting the noise that occurs at the variable gain amplifier by means of the filter. By optimizing the circuit sequence according to the processing performed on the audio signal, such an arrangement reduces noise.

Also, with an embodiment, when the gain set for the variable gain amplifier is greater than a predetermined threshold value, the matrix switch circuit may be set to the first state. Also, when the gain set for the variable gain amplifier is smaller than the predetermined threshold value, the matrix switch circuit may be set to the second state.

By switching the state of the matrix switch circuit according to the gain of the variable gain amplifier, such an arrangement reduces the overall noise in the audio signal processing circuit.

Also, the matrix switch circuit may comprise: a first input switch arranged between the input port and the input terminal of the filter; a second input switch arranged between the input port and the input terminal of the variable gain amplifier; a first intermediate switch arranged between the output terminal of the filter and the input terminal of the variable gain amplifier; a second intermediate switch arranged between the output terminal of the variable gain amplifier and the input terminal of the filter; a first output switch arranged between the output terminal of the filter and the output port; and a second output switch arranged between the output terminal of the variable gain amplifier and the output port.

Also, the matrix switch circuit may be configured to be seamlessly and softly switched between the first state and the second state.

Such an arrangement prevents noise that occurs due to signal discontinuity when the state is switched between the first state and the second state.

Also, the matrix switch circuit may comprise: a first soft switch circuit having a first input terminal and a second input terminal, and an output terminal connected to the input terminal of the filter, and configured to select one from among the signals input via the first and second input terminals, to output the signal thus selected via the output terminal thereof, and to softly switch the signal output via the output terminal from a signal input via one input terminal to another signal input via the other input terminal when the signal selection is switched; a second soft switch circuit having a first input terminal and a second input terminal, and an output terminal connected to the output port, and configured to select one from among the signals input via the first and second input terminals, to output the signal thus selected via the output terminal thereof, and to softly switch the signal output via the output terminal from a signal input via one input terminal to another signal input via the other input terminal when the signal selection is switched; a first input switch arranged between the input port and the first input terminal of the first soft switch circuit; a second input switch arranged between the input port and the input terminal of the variable gain amplifier; a third input switch arranged between the input port and the second input terminal of the first soft switch circuit; a first intermediate switch arranged between the output terminal of the filter and the input terminal of the variable gain amplifier; a second intermediate switch arranged between the output terminal of the variable gain amplifier and the first input terminal of the first soft switch circuit; a first output switch arranged between the output terminal of the filter and the first input terminal of the second soft switch circuit; a second output switch arranged between the output terminal of the variable gain amplifier and the first input terminal of the second soft switch circuit; and a third output switch arranged between the output terminal of the filter and the second input terminal of the second soft switch circuit.

With such an arrangement, two soft switches are employed, thereby enabling the state to be seamlessly and softly switched between the first state and the second state.

Such an embodiment including such two variable gain amplifiers provides: (1) seamless switching from the first state to the second state; (2) seamless switching from the second state to the first state; (3) seamless switching from the first state with a certain gain to the first state with another different gain; and (4) seamless switching from the second state with a certain gain to the second state with another different gain.

Also, an audio signal processing circuit according to an embodiment may further comprise a replica variable gain amplifier configured to amplify or attenuate an audio signal. Also, the matrix switch circuit may comprise: a fourth input switch arranged between the input port and the input terminal of the replica variable gain amplifier; a third intermediate switch arranged between the output terminal of the filter and the input terminal of the replica variable gain amplifier; a fourth intermediate switch arranged between the output terminal of the replica variable gain amplifier and the first input terminal of the first soft switch circuit; a fifth intermediate switch arranged between the output terminal of the variable gain amplifier and the second input terminal of the first soft switch circuit; a sixth intermediate switch arranged between the output terminal of the replica variable gain amplifier and the second input terminal of the first soft switch circuit; and a fourth output switch arranged between the output terminal of the replica variable gain amplifier and the first input terminal of the second soft switch circuit.

Such an embodiment including such two variable gain amplifiers provides: (1) seamless switching from the first state to the second state; (2) seamless switching from the second state to the first state; (3) seamless switching from the first state with a certain gain to the first state with another different gain; and (4) seamless switching from the second state with a certain gain to the second state with another different gain.

Another embodiment of the present invention relates to a tone control circuit configured to correct a frequency band of an audio signal received via a first port thereof, and to output the audio signal thus corrected via a second port thereof. The tone control circuit comprises: an audio signal processing circuit according to any one of the above-described embodiments; a first switch arranged between the input port of the audio signal processing circuit and the first port; a mixer circuit configured to mix the signal input via the first input port and a signal output via the output port of the audio signal processing circuit, and to output the signal thus mixed to the second port; an inverting amplifier configured to invert the signal output via the second port; and a second switch arranged between an output terminal of the inverting amplifier and the input port of the audio signal processing circuit.

Also, when the first switch is switched on and the second switch is switched off, the matrix switch circuit may be set to the first state. Also, when the second switch is switched on, and the first switch is switched off, the matrix switch circuit may be set to the second state.

With such an arrangement, in a case in which the tone control circuit is used as a boost circuit, the variable gain amplifier is selected as a component upstream of the filter. In a case in which the tone control circuit is used as a cut circuit, the variable gain amplifier is selected as a component downstream of the filter. Thus, such an arrangement is capable of suitably reducing noise.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B. In the same way, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

1. First Embodiment

Figure 1:
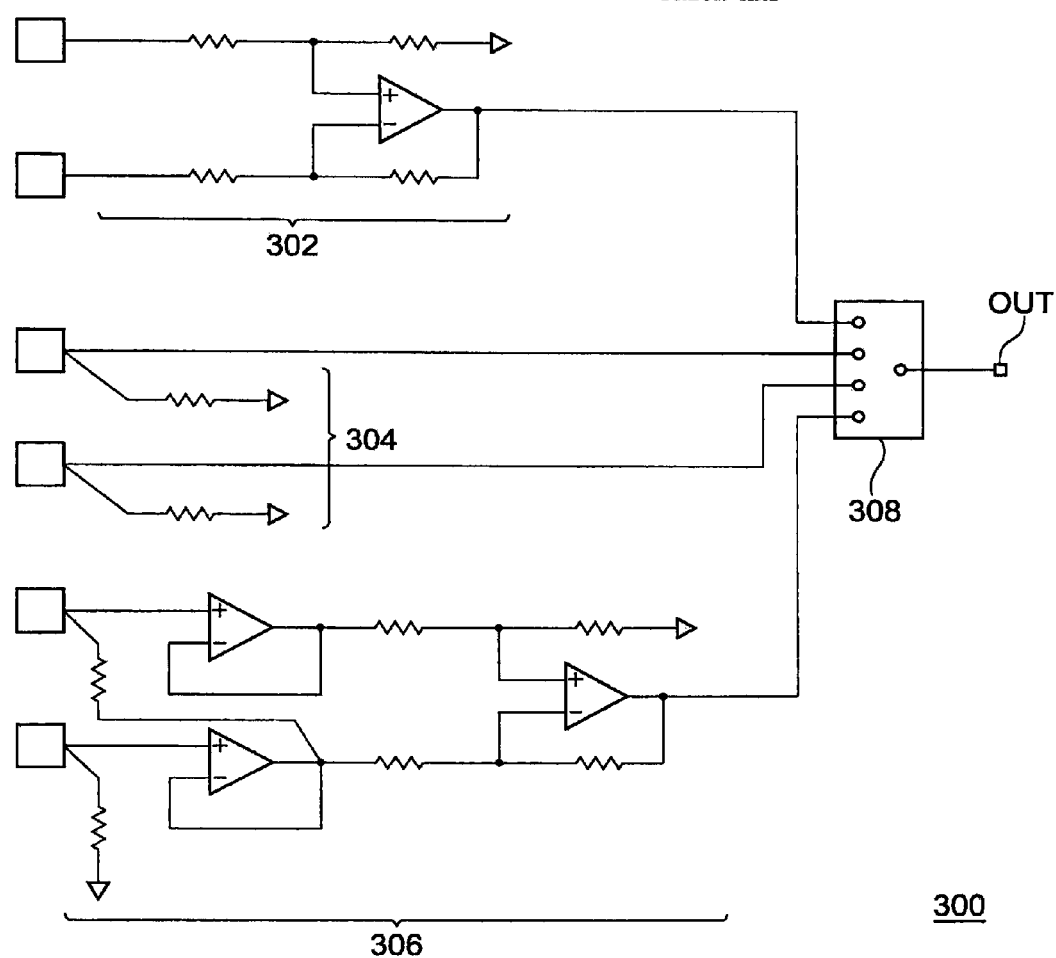
FIG. 1 is a circuit diagram which shows a configuration of a typical input selector which supports various kinds of signal input formats.
Figure 2:
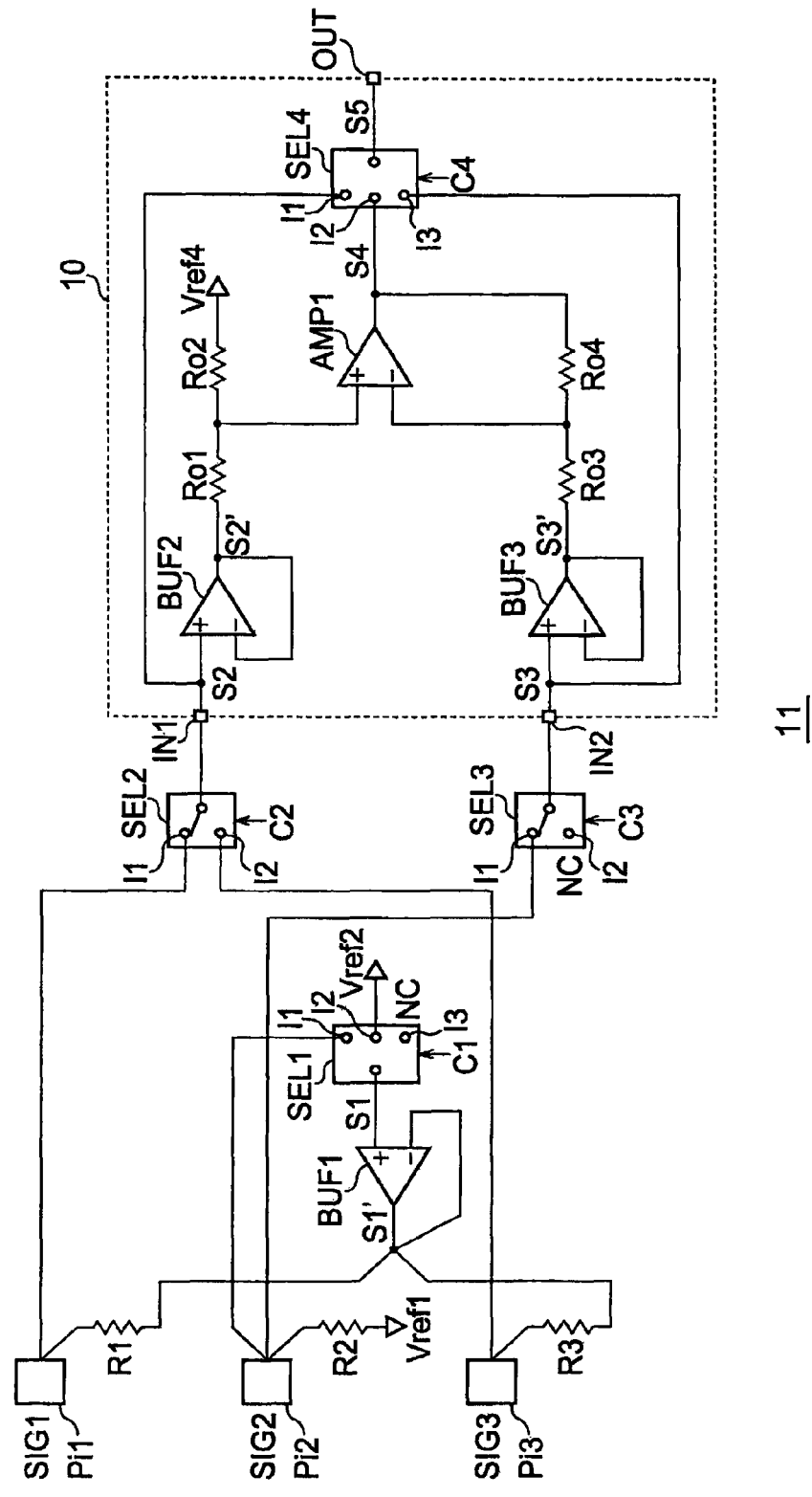
FIG. 2 is a circuit diagram which shows a configuration of an input selector according to a first embodiment.

FIG. 2 is a circuit diagram which shows a configuration of an input selector 11 according to a first embodiment.

The input selector 11 includes a first input port Pi1 through a third input port Pi3, a first resistor R1 through a third resistor R3, a first buffer BUF1, a first selector SEL1 through a third selector SEL3, and an output circuit 10. In the drawings of the present specification, each output terminal of each SEL is indicated by a solid circle, and each input terminal thereof is indicated by a hollow circle.

The first input port Pi1 through the third input port Pi3 receive a first input signal SIG1 through a third input signal SIG3, respectively. The input signals SIG1 through SIG3 are all analog audio signals, for example.

One terminal of the first resistor R1 is connected to the first input port Pi1. One terminal of the second terminal R2 is connected to the second input port Pi2, and a first reference voltage Vref1 is applied to the other terminal thereof. One terminal of the third resistor R3 is connected to the third input port Pi3.

The first selector SEL1 receives the second input signal SIG2 via a first input terminal I1, and receives a second reference voltage Vref2 via a second input terminal I2, and selects either one. In FIG. 2, the first selector SEL1 includes three input terminals I1 through I3. However, the terminal P3 is not connected (NC: non-connection), and accordingly, a two-input selector may be employed.

The first buffer BUF1 receives an output signal S1 of the first selector SEL1, and outputs, to the other terminal of the first resistor R1 and the other terminal of the third resistor R3, a signal S1' that corresponds to the output signal S1.

The second selector SEL2 receives the first input signal SIG1 via the first input terminal I1, and receives the third input signal SIG3 via the second input terminal I2, and selects either one.

The second input signal SIG2 is input to one input terminal (first input terminal I1) of the third selector SEL3, and the other input terminal (second input terminal I2) thereof is not connected (NC). Accordingly, the third selector SEL3 can be replaced by a simple wiring line. However, by providing such a third selector SEL3, the impedance of the path on the second selector SEL2 side is set to the same impedance as that of the path on the third selector SEL3 side, thereby providing the advantage of reducing waveform distortion. In particular, such an arrangement is effectively applied to an arrangement in which the positive component and the negative component of a differential signal are transmitted via respective paths. In FIG. 2, an output signal S3 of the third selector SEL3 is the same as the second input signal SIG2.

The output circuit 10 includes a first input terminal IN1, a second input terminal IN2, and an output terminal OUT. The output circuit 10 is configured so as to allow the output mode to be switched between a state in which a signal received via the first input terminal IN1 is output as an output signal (first state φ1), a state in which a signal received via the second input terminal IN2 is output as an output signal (second state φ2), and a state in which a signal that corresponds to the difference between the signal received via the first input terminal IN1 and the signal received via the second input terminal IN2 is output as an output signal (third state φ3).

In FIG. 2, the output circuit 10 receives an output signal S2 of the second selector SEL2 via its first input terminal IN1, and receives the output signal S3 of the third selector SEL3 (second input signal SIG2) via its second input terminal IN2.

The output circuit 10 includes a second buffer BUF2, a third buffer BUF3, a fourth selector SEL4, an operational amplifier AMP1, a first output resistor Ro1 through a fourth output resistor Ro4.

The operational amplifier AMP1 includes two input terminals (inverting input terminal and non-inverting input terminal). One terminal of the first output resistor Ro1 is connected to one input terminal (non-inverting input terminal) of the operational amplifier, and the other terminal thereof receives a signal S2' that corresponds to the output signal S2 of the second selector SEL2. Specifically, the second buffer BUF2 is arranged between the first output resistor Ro1 and the second selector SEL2. The second buffer BUF2 receives the output signal S2 of the second selector SEL2, and outputs the output signal S2' to one terminal of the first output resistor Ro1.

One terminal of the second output resistor Ro2 is connected to one input terminal (non-inverting input terminal) of the operational amplifier AMP1, and a fourth reference voltage Vref4 is applied to the other terminal thereof.

The first reference voltage Vref1 through the fourth reference voltage Vref4 may be generated using a single common voltage source. Also, these reference voltages may be generated using separate voltage sources. In other words, the reference voltages Vref1 through Vref3 may be set to the same voltage value. Also, these reference voltages may be individually adjustable. In a case in which a differential signal or a ground isolation signal is to be input, the reference voltage may be set to the common level of the differential signal. Alternatively, the first reference voltage Vref1 through the fourth reference Vref4 may each be set to the ground voltage.

One terminal of the third resistor R3 is connected to the other input terminal (non-inverting input terminal) of the operational amplifier AMP1, and a signal S3' that corresponds to the second input signal SIG2 is input to the other terminal thereof. Specifically, the third buffer BUF3 is provided between the third output resistor Ro3 and the third selector SEL3. The third buffer BUF3 receives the output signal S3 of the third selector SEL3, and outputs the signal thus received to one terminal of the third output resistor Ro3.

One terminal of the fourth output resistor Ro4 is connected to the other input terminal (inverting input terminal) of the operational amplifier AMP1, and the other terminal thereof is connected to the output terminal of the operational amplifier AMP1.

It should be noted that, in a case in which the output impedance of a circuit connected to each of the first input port Pi1 through the third input terminal Pi3 is sufficiently low, or in a case in which a certain level of waveform distortion is permissible in the transmission of signals via the input selector 11, the second buffer BUF2 and the third buffer BUF3 may be eliminated. Conversely, by providing the second buffer BUF2 and the third buffer BUF3, such an arrangement reduces waveform distortion.

The fourth selector SEL4 receives an output signal S4 of the operational amplifier AMP1, a signal that corresponds to the signal input via the first input terminal IN1 of the output circuit 10 (e.g., the first input signal SIG1 or the third input signal SIG3), and a signal that corresponds to a signal input via the second input terminal IN2 of the output circuit 10 (i.e., the second input signal) via the first input terminal IN1 through the third input terminal I3, and selects any one of these signals.

The output signals S2' and S3', which are respectively output from the second buffer BUF2 and the third buffer BUF3, may be respectively input to the first input terminal I1 and the third input terminal I3 of the fourth selector SEL4. An output signal S5 of the fourth selector SEL4 is output to an unshown circuit as a signal selected by the input selector 11.

The first state φ1 is a state in which the fourth selector SEL4 selects the first input terminal IN1. The second state φ2 is a state in which the fourth selector SEL4 selects the third input terminal IN3. The third state φ3 is a state in which the fourth selector SEL4 selects the second input terminal IN2.

The above is the configuration of the input selector 11. Next, description will be made regarding the operation thereof. The state of the input selector 11 is determined according to the selection states of the first selector SEL1 through the fourth selector SEL4. Hereafter, the input terminal number selected by the first selector SEL1 will be indicated by "C1", the input terminal number selected by the second selector SEL2 will be indicated by "C2", the input terminal number selected by the third selector SEL3 will be indicated by "C3" (=1), and the input terminal number selected by the fourth selector SEL4 will be indicated by "C4". For example, in a state in which the first selector SEL1 selects the first input terminal I1, and the fourth selector SEL4 selects the second input terminal 12, the state is represented by "C1=1, C4=2". The symbols C1 through C4 can be understood to be control signals for the selectors SEL1 through SEL4. It should be noted that, in the configuration shown in FIG. 2, C3 is fixedly set to 1, and accordingly, will be omitted from the state of the input selector 11.

1. Single-Ended Input

1a. C4=1, C1=2, C2=i (i=1 or 2)

In this state, when i=1, such an arrangement is capable of receiving, via the first input port Pi1, the first input signal SIG1 transmitted in a single-ended format, and when i=2, such an arrangement is capable of receiving, via the third input port Pi3, the third input signal SIG3 transmitted in a single-ended format.

1b. C4=3

In this state, such an arrangement is capable of receiving, via the second input port Pi2, the second input signal SIG2 transmitted in a single-ended format. In this case, C1 is a redundant term DC (Don't Care).

2. Differential Output

C4=2, C2=i (i=1 or 2)

The first buffer BUF1 is turned off, and the output impedance thereof is set to a sufficiently large value. Furthermore, the voltage source configured to generate the reference voltage Vref1 is turned off, and the output impedance thereof is set to a sufficiently large value.

When i=1, such an arrangement is capable of receiving, via the first input port Pi1 and the second input port Pi2, the input signals SIG1 and SIG2 transmitted in a differential format.

When i=2, such an arrangement is capable of receiving, via the third input port Pi3 and the second input port Pi2, the input signals SIG3 and SIG2 transmitted in a differential format.

3. Ground Isolation Input

C4=2, C1=1, C2=i (i=1 or 2)

The voltage source configured to generate the first reference voltage Vref1 is turned on, and the first buffer BUF1 is turned on.

When i=1, such an arrangement is capable of receiving, via the first input port Pi1 and the second input port Pi2, the input signals SIG1 and SIG2 transmitted in a ground isolation format.

When i=2, such an arrangement is capable of receiving, via the third input port Pi3 and the second input port Pi2, the input signals SIG3 and SIG2 transmitted in a ground isolation format.

As described above, by switching the combination of the states of the switches, the input selector 11 shown in FIG. 2 is capable of receiving input signals in various signal formats.

Figure 3:
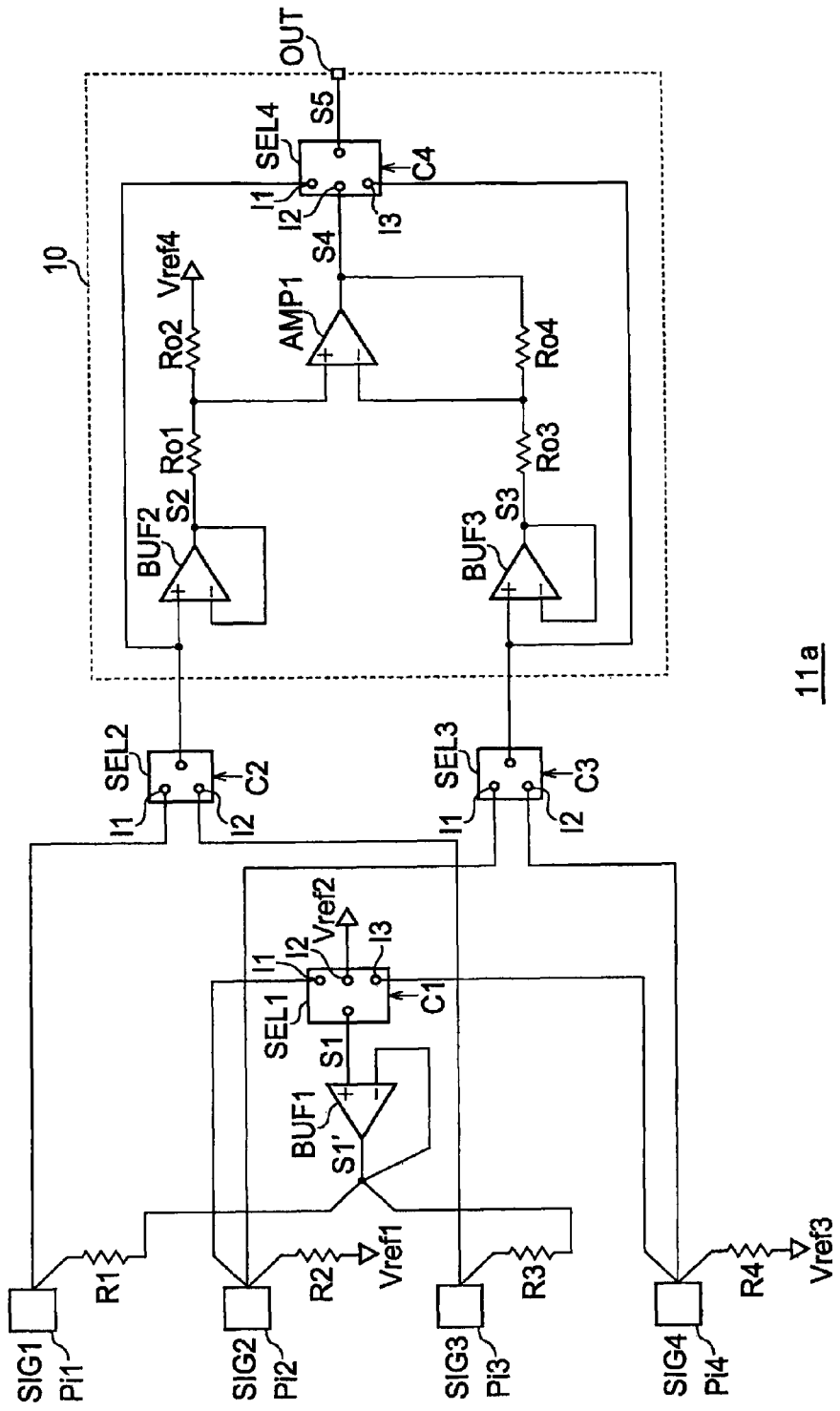
FIG. 3 is a circuit diagram which shows a configuration of an input selector according to a first modification.

FIG. 3 is a circuit diagram which shows the configuration of an input selector 11a according to a first modification. The input selector 11a further includes a fourth input port Pi4 and a fourth resistor R4, in addition to the input selector 11 shown in FIG. 2.

The fourth input port Pi4 receives a fourth input signal SIG4. One terminal of the fourth resistor R4 is connected to the fourth input port Pi4, and the third reference voltage Vref3 is applied to the other terminal thereof. The third reference voltage Vref3 may be the same as the other reference voltages, or it may be set to a different voltage.

The first selector SEL1 shown in FIG. 3 further receives a fourth input signal SIG4 as an input signal, in addition to the second input signal SIG2 and the second reference voltage Vref2, and is configured to be capable of selecting one of the signals input via the input terminals I1 through I3. The third selector SEL3 shown in FIG. 3 receives the fourth input signal SIG4 as an input signal, in addition to the second input signal SIG2, and is configured to be capable of selecting one of the signals input via the input terminals I1 and I2.

The above is the configuration of the input selector 11a shown in FIG. 3. Next, description will be made regarding the operation thereof.

1. Single-Ended Input

1a. C4=1, C1=2, C2=i (i=1 or 2)

In this state, when i=1, such an arrangement is capable of receiving, via the first input port P11, the first input signal SIG1 transmitted in a single-ended format. On the other hand, when i=2, such an arrangement is capable of receiving, via the third input port Pi3, the third input signal SIG3 transmitted in a single-ended format.

1b. C4=3, C3=j (j=1 or 2)

When j=1, such an arrangement is capable of receiving, via the second input port Pi2, the second input signal SIG2 transmitted in a single-ended format. When j=2, such an arrangement is capable of receiving, via the fourth input port Pi4, the fourth input signal SIG4 transmitted in a single-ended format. C1 and C2 are each redundant terms (DC).

2. Differential Output

C4=2, C2=i (i=1 or 2), C3=j (j=1 or 2)

The first buffer BUF1 is turned off, and the output impedance thereof is set to a sufficiently large value. Furthermore, the voltage sources configured to generate the reference voltages Vref1 and Vref4 are turned off, and their output impedances are set to sufficiently large values.

In this case, when i=1, such an arrangement is capable of receiving one component of a differential input signal pair via the first input port Pi1, and when i=2, such an arrangement is capable of receiving one component of a differential input signal pair via the third input port Pi3. Furthermore, when j=1, such an arrangement is capable of receiving the other component of a differential input signal pair via the second input port Pi2, and when j=2, such an arrangement is capable of receiving the other component of a differential input signal pair via the fourth input port Pi4.

3. Ground Isolation Input

3a. C4=2, C1=1, C2=i (i=1 or 2), C3=1

The voltage source configured to generate the first reference voltage Vref1 is turned on, and the first buffer BUF1 is turned on.

When i=1, such an arrangement is capable of receiving, via the first input port Pi1 and the second input port Pi2, the input signals SIG1 and SIG2 transmitted in a ground isolation format.

When i=2, such an arrangement is capable of receiving, via the third input port Pi3 and the second input port Pi2, the input signals SIG3 and SIG2 transmitted in a ground isolation format.

3b. C4=2, C1=3, C2=i (i=1 or 2), C3=2

The voltage source configured to generate the third reference voltage Vref3 is turned on, and the first buffer BUF1 is turned on.

When i=1, such an arrangement is capable of receiving, via the first input port Pi1 and the fourth input port Pi4, the input signals SIG1 and SIG4 transmitted in a ground isolation format.

When i=2, such an arrangement is capable of receiving, via the third input port Pi3 and the fourth input port Pi4, the input signals SIG3 and SIG4 transmitted in a ground isolation format.

As described above, compared to the input selector 11 shown in FIG. 2, the input selector 11a shown in FIG. 3 is capable of supporting more varied combinations of input formats.

Figure 4:
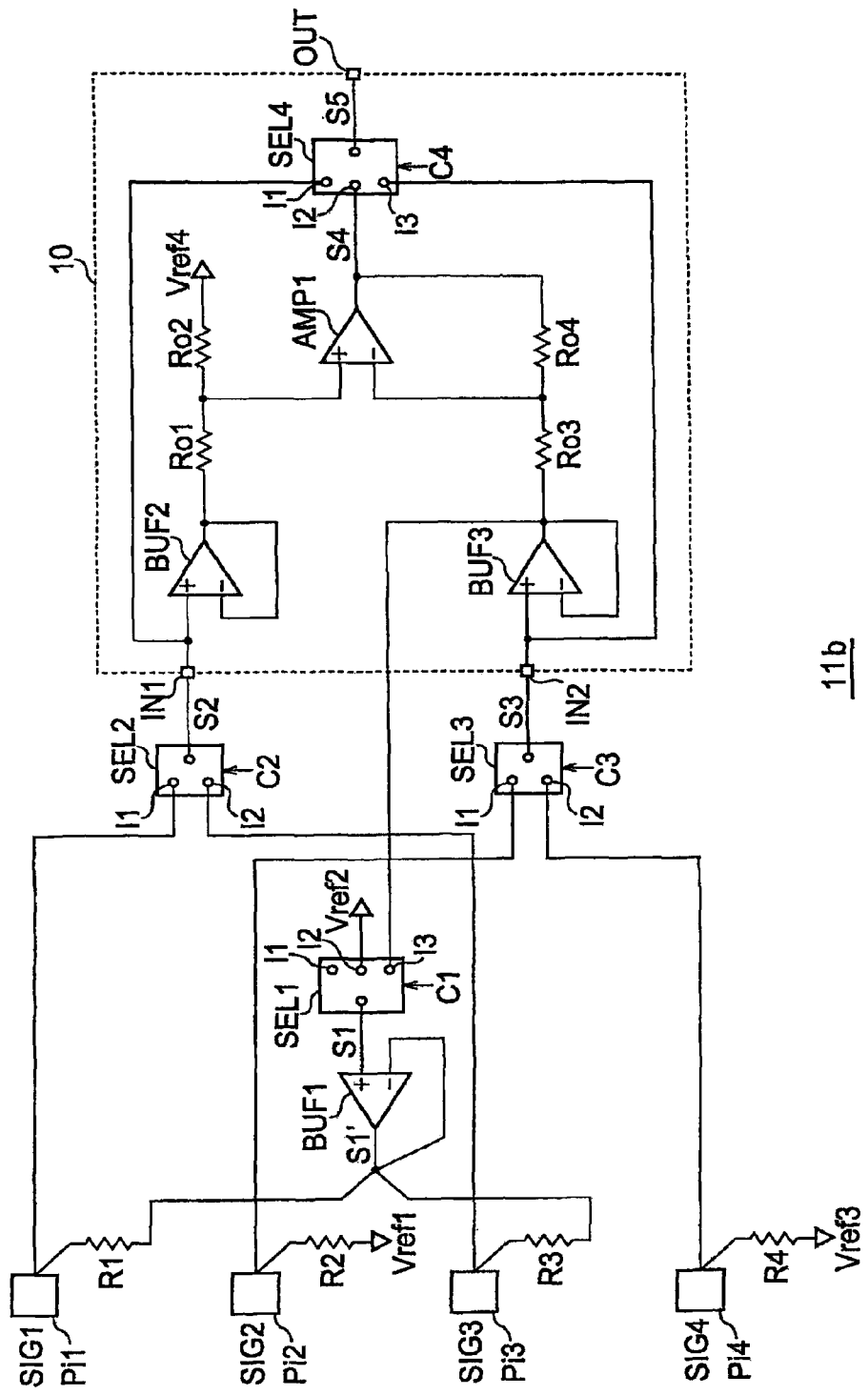
FIG. 4 is a circuit diagram which shows a configuration of an input selector according to a second modification.

FIG. 4 is a circuit diagram which shows the configuration of an input selector 11b according to a second modification. The input selector 11b shown in FIG. 4 has the same configuration as that of the input selector 11a shown in FIG. 3, except for a difference in the input of the first selector SEL1. Specifically, in FIG. 3, the second input signal SIG2 and the fourth input signal SIG4 are input to the first selector SEL1 via the first input terminal I1 and the third input terminal 13, respectively. On the other hand, in FIG. 4, the output signal S3 of the third selector SEL3 is input to the third input terminal 13, and the first input terminal I1 is not connected. As described above, the output signal S3 of the third selector SEL3 can be switched between the second input signal SIG2 and the fourth input signal SIG4. Thus, such an arrangement provides the equivalent function to the input selector 11a shown in FIG. 3. With such an arrangement, the first selector SEL1 can have two inputs, thereby providing a reduced circuit scale.

Furthermore, the first selector SEL1 receives the output signal S2 of the third selector SEL3 as an input signal via the third buffer BUF3. Thus, the first buffer BUF1 can be eliminated.

Figure 5:
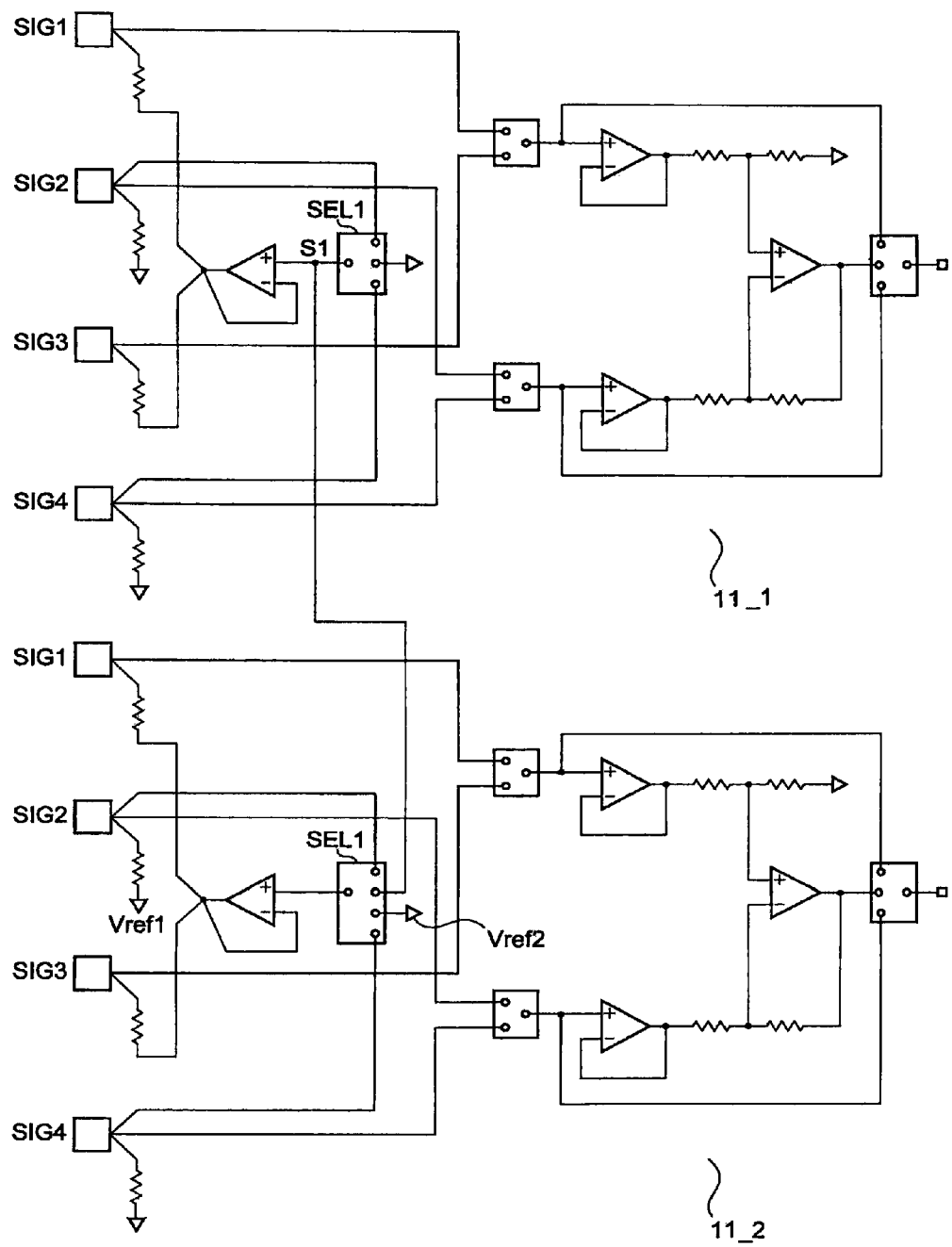
FIG. 5 is a circuit diagram which shows a configuration of an input selector according to a third modification.

FIG. 5 is a circuit diagram which shows the configuration of an input selector 11c according to a third modification. The input selector 11c includes the two input selectors 11_1 and 11_2 shown in FIG. 2. An input selector having any of the configurations described above may be employed for each of the two input selectors 11_1 and 11_2. FIG. 5 shows an arrangement employing the input selectors 11a shown in FIG. 3. By providing two input selector lines, such an arrangement is capable of suitably receiving a two channel stereo audio signal. In FIG. 5, reference numerals to denote various components are omitted without impairing the scope of the description.

Furthermore, the modification shown in FIG. 5 includes the following features that should be noted. That is to say, the first selector SEL1 on the input selector side 11_2 side, which is one of the two input selectors, receives the output signal S1 of the first selector SEL1 on the other input selector side 11_1, in addition to its own second input signal SIG2, second reference voltage Vref2, and fourth input signal SIG4.

By making various combinations of the two lines of the input selectors 11, such a modification is capable of supporting more varied combinations of input signal formats.

As yet another modification, the first selector SEL1 on the input selector 11_1 side, which is one of the two input selector sides, may receive the output signal S1 of the first selector SEL1 on the other input selector side, i.e., the input selector 11_2 side, in addition to its own second input signal SIG2, second reference voltage Vref2, and fourth input signal SIG4.

The input selector 11 shown in FIG. 2 has three inputs. Also, the input selector 11 may have two inputs. In this case, the third input port Pi3 and the third resistor R3 should be eliminated, and the second terminal 12 of the second selector SEL2 should be set to the non-connection (NC) state. Such an arrangement is capable of receiving a single-ended signal, a differential signal, and a ground isolation signal as the first input signal SIG1 and the second input signal SIG2.

Furthermore, both the second selector SEL2 and the third selector SEL3 may be eliminated. In this case, the two path have the same impedance. Furthermore, such an arrangement reduces the number of unnecessary components on the signal paths as compared with an arrangement including the second selector SEL2 and the third selector SEL3, thereby reducing signal distortion.

In summary, using such an input selector 11 having various configurations described above, such an arrangement allows a designer of electronic devices mounting the input selector 11 to assign various input signal formats to each input port of the input selector 11 in a flexible manner. Furthermore, by switching the respective selectors only, such an arrangement supports a situation in which design a change is requested.

Description has been made regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Figure 6:
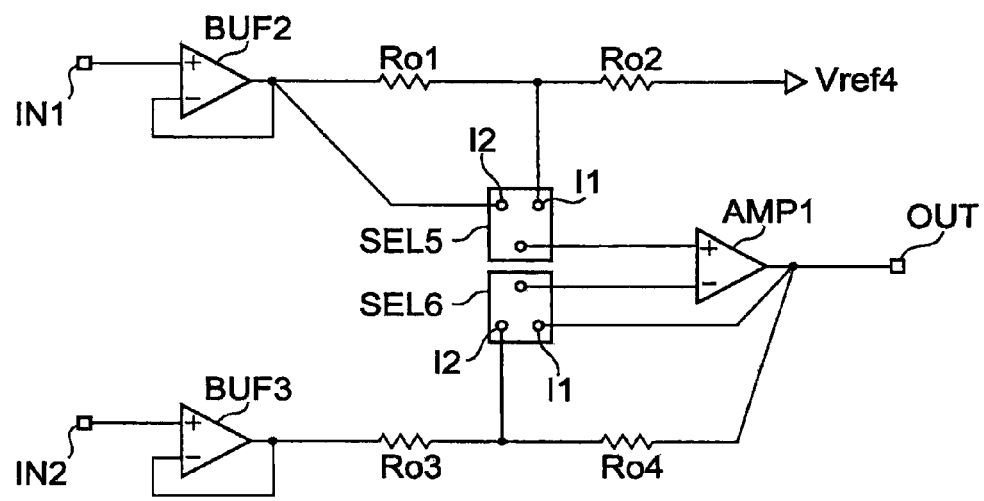
FIG. 6 is a circuit diagram which shows another configuration of an output circuit.

FIG. 6 is a circuit diagram which shows another configuration of the output circuit. An output circuit 10a shown in FIG. 6 includes a fifth selector SEL5 and a sixth selector SEL6, instead of the fourth selector SEL4 included in the output circuit 10 shown in FIG. 2 and so forth.

An output terminal of the fifth selector SEL5 is connected to one input terminal (non-inverting input terminal) of the operational amplifier AMP1. A first input terminal I1 of the sixth selector SEL6 is connected to the output terminal of the operational amplifier AMP1, and an output terminal of the sixth selector SEL6 is connected to the other input terminal (inverting input terminal) of the operational amplifier AMP1. One terminal of the first output resistor Ro1 is connected to the first input terminal I1 of the fifth selector SEL5. The first output resistor Ro1 receives, via the other terminal thereof, a signal that corresponds to the signal input via the first input terminal IN1 of the output circuit 10a. One terminal of the second output resistor Ro2 is connected to the first input terminal I1 of the fifth selector SEL5. The fourth reference voltage Vref4 is applied to the other terminal of the second output resistor Ro2. One terminal of the third output resistor Ro3 is connected to the second input terminal 12 of the sixth selector SEL6. The third output resistor Ro3 receives, via the other terminal thereof, a signal that corresponds to the signal input via the second input terminal IN2 of the output circuit 10. One terminal of the fourth output resistor Ro4 is connected to the second input terminal 12 of the sixth selector SEL6, and the other terminal thereof is connected to the output terminal of the operational amplifier AMP1.

The output circuit 10a shown in FIG. 6 operates as follows.
When C5=2, and C6=1, the state is set to the first state φ1.
When C5=1, and C6=2, the state is set to the second state φ2.

2. Second Embodiment

2.1 Background

In general, electronic devices having a function of reproducing an audio signal, such as CD players, audio amplifiers, car stereo systems, portable radios, portable audio players, etc., include a volume controller which allows the volume of the sound to be adjusted, and an equalizer which allows the frequency characteristics of the sound to be adjusted. The control operation for such a volume controller or an equalizer is performed by adjusting the amplitude of an audio signal.

The audio signal is amplified by an amplifier, and in the final stage, the audio signal thus amplified is output as sound from speakers or headphones, which are electroacoustic conversion elements. The sound volume can be adjusted by controlling the gain of the amplifier, or by controlling the attenuation rate. For example, electronic volume circuits are disclosed in Patent documents 1 and 2, in which the gain of the amplifier or the attenuation rate of the amplifier is controlled by switching the resistance of a variable resistor.

The volume circuit is integrated with an input selector configured to select multiple input sources, an input gain control circuit configured to equalize the levels of the multiple input sources, a tone control circuit configured to amplify or attenuate a predetermined frequency band, and so forth. Such a circuit will be referred to as an "audio signal processing circuit".
[Patent Document 1]
Japanese Patent Application Laid Open No. 2005-117489
[Patent Document 2]
Japanese Patent Application Laid Open No. 2005-217710
[Patent Document 3]
Japanese Patent Application Laid Open No. 2004-222077
[Patent Document 4]
Japanese Patent Application Laid Open No. H11-340759

2.2 Problem

Such an audio signal processing circuit has a configuration in which an input selector, an input gain control circuit, a volume circuit, and a tone control circuit (each of which will be referred to as a "processing block") are connected in cascade.

In general, an input buffer is provided as an input stage for each processing block in order to raise the input impedance. Accordingly, an audio signal is passed through the input buffer provided to the processing block, leading to degradation of audio quality, which cannot be avoided even if no processing is performed on the audio signal. Also, in a case in which the audio signal is passed through unnecessary circuit components or wiring lines, the audio signal is degraded even if such an input buffer is not provided. Also, such a problem can occur in a signal processing circuit which processes signals other than audio signals.

An embodiment of the present invention has been made in order to solve such a problem. Accordingly, it is a general purpose of the present invention to provide a technique for suppressing signal degradation. Description will be made in the following second embodiment regarding such a technique.

Figure 7:
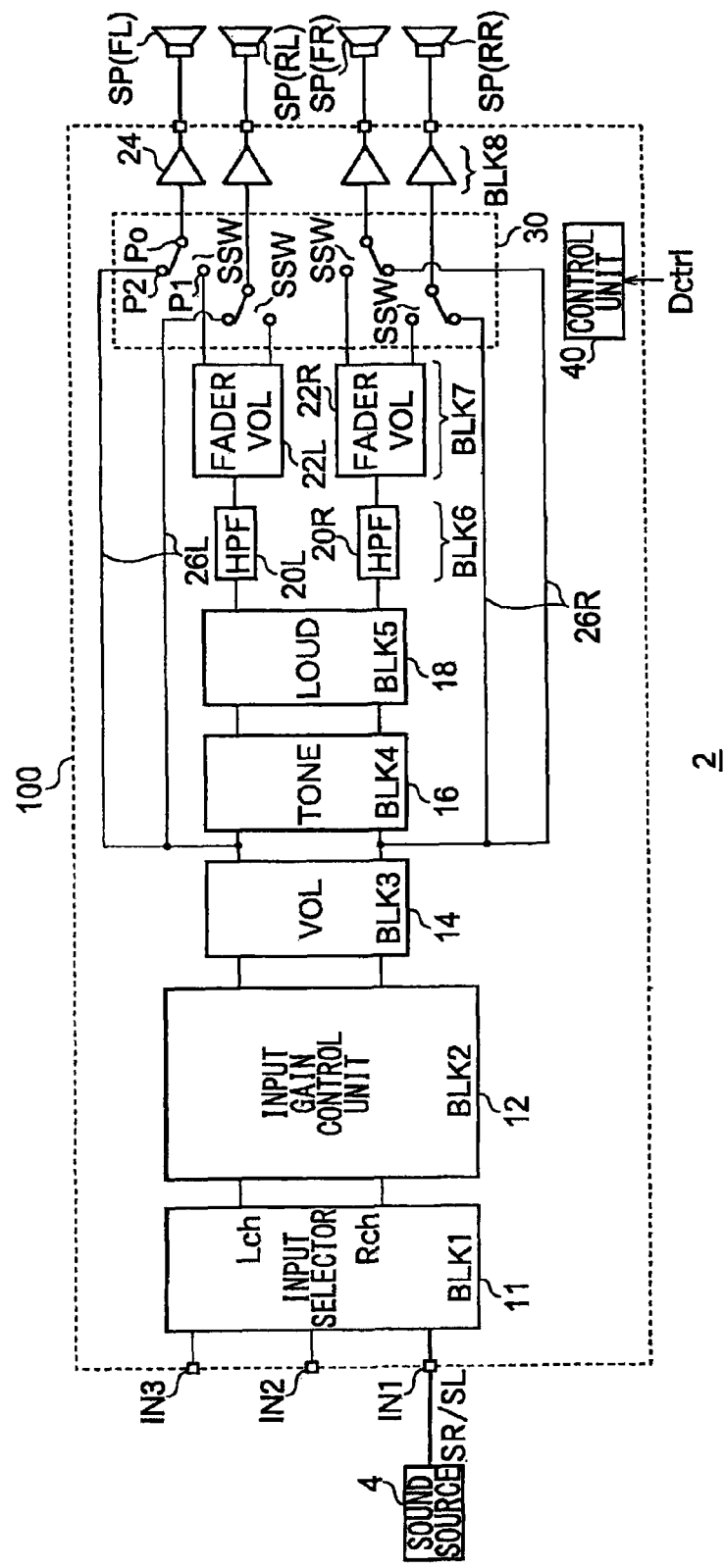
FIG. 7 is a block diagram which shows a signal processing circuit according to a second embodiment.

FIG. 7 is a block diagram which shows the configuration of a signal processing system 100 according to a second embodiment. The signal processing system 100 processes an audio signal as a processing target. The signal processing system 100 adjusts the sound volume of the audio signal, amplifies the audio signal, performs frequency band correction thereof, and outputs the audio signal thus processed to an electroacoustic conversion element (which will be referred to as "speakers SP" hereafter) such as speakers or headphones, which are provided as downstream components. The signal processing system 100, a sound source 4, and the speakers SP form an audio system 2.

The audio system 2 is a vehicle audio system, for example. The sound source 4 is a CD player, a DVD player, a car navigation system, or the like, and outputs two channels of audio signals SR and SL (R channel and L channel). In another embodiment, the sound source 4 may output a sound signal having 5.1 audio channels. The audio system 2 outputs audio signals via a total of four speakers, i.e., two front speaker channels SP (FR) and SP (FL), and two rear speaker channels SP (RR) and SP (RL). Also, the audio system 2 may include an unshown subwoofer.

The signal processing system 100 includes multiple (e.g., three) lines of external inputs IN1 to IN3, and is capable of receiving two channels of audio signals SR/SL via each external input terminal from an external circuit. For example, a signal from a CD player is input via the first external input IN1. A signal from a car navigation system is input via the external input IN2. A signal from a portable digital audio player is input via the external input IN3.

The signal processing system 100 includes n (n is an integer of 2 or more) processing blocks BLK1 through BLKn connected in cascade, bypass lines 26L and 26R, a soft switch circuit 30, and a control unit 40. In order to facilitate understanding, FIG. 7 shows an example in which n=8. Also, a desired number of such processing blocks may be employed. Each processing block is configured to perform predetermined signal processing on an output signal from an upstream processing block, and to output the signal thus processed to a downstream processing block.

Specifically, the first processing block BLK1 through the eighth processing block BLK8 are provided as an input selector circuit 11, an input gain control circuit 12, a volume circuit 14, a tone control circuit 16, a loudness circuit 18, a high-pass filter 20, a volume fader circuit 22, and a power amplifier 24. The signal processing system 100 includes two signal lines (L channel and R channel) that correspond to the two channels L and R of a stereo system. Each processing block or each signal will be indicated by a label (i.e., L or R) which represents a channel to be processed, as necessary. When there is no need to distinguish between channels in particular, such a label will be omitted.

The processing blocks BLK1 through BLK8 perform the following processing.

BLK1: The input selector circuit 11 selects one of the signals input via the three external input terminals IN1 through IN3. Detailed description has been made in the first embodiment with reference to FIGS. 2 through 6 regarding the input selector circuit 11.

BLK2: The input gain control circuit 12 amplifies (or attenuates) an audio signal output from the input selector circuit 11 in order to equalize the amplitude levels of the audio signals received from external devices connected to the external input terminals IN1 through IN3.

BLK3: The volume circuit 14 amplifies the audio signal with a gain that corresponds to a volume set by the user.

BLK4: The filter of the tone control circuit 16 is configured to be switched between a high-pass filter, a low-pass filter, a bandpass filter, etc. The tone control circuit 16 is a so-called equalizer circuit which amplifies or attenuates the frequency band set by the user. Detailed description of the tone control circuit 16 will be made later in the third and fourth embodiments with reference to FIGS. 9 through 20.

BLK5: In some cases, when the vehicle is in motion, road noise leads to difficulty in hearing an audio signal (in particular, the low-frequency components thereof) reproduced by the speakers. In the ON state, the loudness circuit 18 amplifies and enhances the low-frequency component of the audio signal.

BLK6: In a case in which a subwoofer is provided in addition to four speaker channels, in some cases, the desire is to output sound from the deep bass range to the bass range from the subwoofer, and to output sound from the bass range to the middle and high ranges from the four speaker channels. In this case, the high-pass filter 20 removes the deep bass component which is to be output from the subwoofer. The high-pass filter 20 is switched between the ON state and the OFF state according to the presence or absence of a subwoofer.

BLK7: The volume fader circuit 22 partitions out the sound to the front-side speakers and the rear-side speakers.

BLK8: The power amplifier 24 amplifies the audio signal to a level sufficient to drive the speakers. Also, an additional different power amplifier may be provided as an external component of the signal processing system 100.

The signal processing system 100 includes the bypass lines 26L and 26R (which will be collectively referred to as the "bypass lines 26"), in addition to the multiple processing blocks BLK1 through BLK8. The bypass lines 26 are provided so as to bypass the fourth through seventh processing blocks BLK4 through BLK7.

In general terms, the bypass lines 26 may be provided at desired positions so as to bypass the i-th (i is an integer which satisfies $1 \leq i \leq n$) through j-th (j is an integer which satisfies $i<j<n$) processing blocks. Description will be made later regarding a modification of the combination of "i" and "j".

The soft switch circuit 30 includes a soft switch element SSW for each signal line.

Each soft switch element SSW includes at least two input terminals P1 and P2 and a single output terminal Po. The output signal of the j-th (seventh) processing block BLK7 is input to the first input terminal P1 of each switch SSW. The input signal of the i-th (fourth) processing block (i.e., the output signal of the (i−1)th processing block) is input to the second input terminal P2 of the switch SSW. Each soft switch element SSW receives a switching signal (not shown) from the control unit 40, selects any one of the signals input via the two input terminals P1 and P2, and outputs the signal thus selected. When the signal is switched, the soft switch element SSW softly switches its output signal from a signal input via one input terminal to a signal input via the other input terminal. Such a soft switch element SSW, which can be provided using known techniques or techniques which will be developed in the future, is employed in the audio signal processing field in order to suppress noise which is referred to as pop-up noise, popping, or the like. The configuration of such a soft switch element SSW is not restricted in particular. For example, related techniques are disclosed in Japanese Patent Application Laid Open No. 2006-262264 and Japanese Patent Application Laid Open No. 2006-262265.

The control unit 40 receives control data Dctrl from an unshown external host processor, and provides unified control of the overall operation of the signal processing system 100. The control data Dctrl includes parameters (setting data SD1 through SD8) which define signal processing to be executed by the processing blocks BLK1 through BLK8. Specific examples of these parameters include: data SD1 which indicates an external input channel; data SD2 for setting the input gain; setting data SD3 for setting the volume; data SD4 for setting the frequency characteristics of the equalizer; data SD5 for switching the ON/OFF state of the loudness circuit; data SD6 for switching the cutoff frequency or the attenuation rate of the high-pass filter; data SD7 which specifies how the sound volume is to be partitioned out between the front speakers SP (F) and the rear speakers SP (R).

The control unit 40 monitors the setting data. When the setting data for the i-th (fourth) through j-th (seventh) processing blocks are all set to values which have no effect on the signal to be processed, the control unit 40 instructs the soft switch circuit 30 to select the signal input via each second input terminal P2. In this case, the fourth through seventh processing blocks BLK4 through BLK7 are bypassed.

On the other hand, when at least one of the setting data for any one of the i-th through j-th processing blocks is set to a value that has an effect on the signal to be processed, the control unit 40 instructs the soft switch circuit 30 to select a signal input via each first input terminal P1. In this case, the power amplifier 24 receives, as an input signal, the audio signal which has passed through the fourth through seventh processing blocks BLK4 through BLK7.

Figure 8:
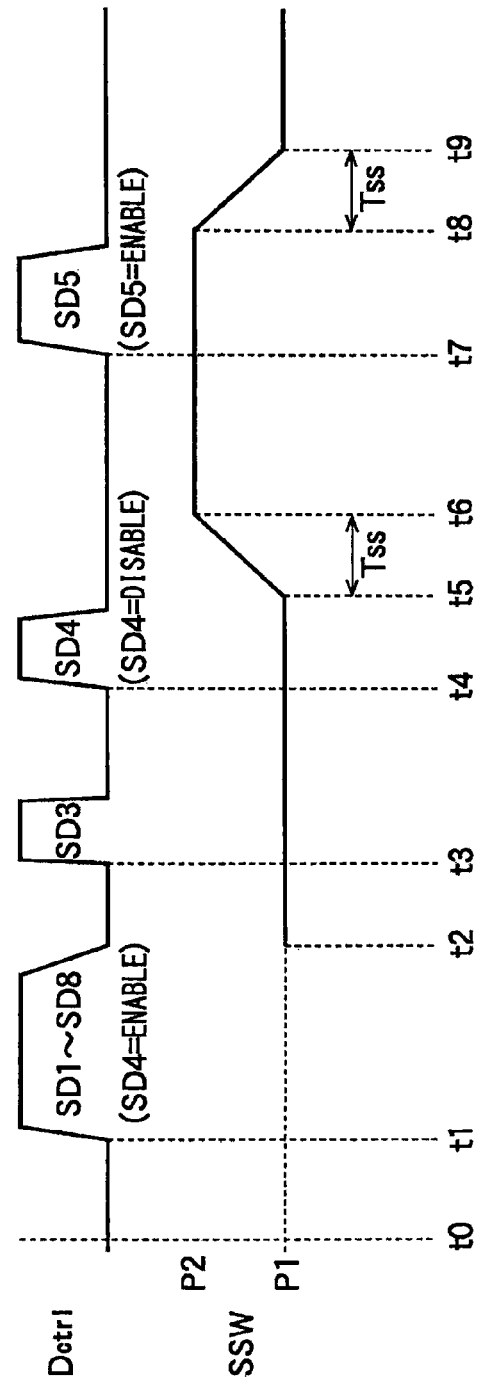
FIG. 8 is a time chart which shows the operation of the signal processing circuit shown in FIG. 7.

The above is the configuration of the signal processing system 100. Next, description will be made regarding the operation thereof. FIG. 8 is a time chart which shows the operation of the signal processing system 100 shown in FIG. 7. "Dctrl" represents the control data input to the control unit 40. "SSW" represents the state of each soft switch element SSW (the low level thereof corresponds to the state in which the first input terminal P1 is selected, and the high level thereof corresponds to the state in which the second input terminal P2 is selected).

At the time point t0, the power supply for the signal processing system 100 is turned on. At the time point t1, the control unit 40 receives the control signal Dctrl from the host processor. The control unit 40 sets the states of the processing blocks BLK1 through BLK7 based upon the control signal Dctrl.

Let us consider a case in which a certain gain and a certain bandwidth are set for the tone control unit 16 (BLK4) according to the setting data SD4. Furthermore, let us say that the parameters for other processing blocks have no effect on the audio signal. In this case, the control unit 40 judges that the tone control circuit 16 has an effect on the audio signal, and instructs the soft switch circuit 30 to select the signal input via the first input terminal (time point t2). As a result, the speakers SP reproduce an audio signal of which the bandwidth has been adjusted by the tone control circuit 16.

Subsequently, the user gives an instruction to change the volume. In this case, the host processor outputs, to the control unit 40, a parameter (setting data SD3) which sets the gain of the volume circuit 14 (processing block BLK3), thereby changing the gain of the volume circuit 14 (time point t3). With such an arrangement, the volume circuit 14 (processing block BLK3) does not correspond to any one of the fourth through seventh blocks, and accordingly, such an instruction has no effect on the control operation of the soft switch circuit 30.

Let us say that, subsequently, the user disables (deactivates) the tone control circuit. In this case, the host processor outputs, to the control unit 40, the setting data SD4 which specifies the gain, bandwidth, and Q value of the tone control circuit 16 so as to provide flat frequency characteristics (time point t4). As a result, all the setting data SD4 through SD7, which are to be set for the i-th (fourth) through j-th (seventh) processing blocks, are set to values having no effect on the signal to be processed. In this state, over a predetermined soft start period Tss, the control unit 40 softly switches the soft switch circuit 30 from the state in which the first input terminal P1 is selected to the state in which the second input terminal P2 is selected (time points t5 to t6).

As a result, the fourth through seventh processing blocks BLK4 through BLK7 are bypassed. That is to say, the audio signal is seamlessly switched from the state in which the audio signal is output from the speakers via all the processing blocks BLK1 through BLK8, to the state in which the audio signal is output from the speakers via the input selector circuit 11, the input gain control circuit 12, the volume circuit 14, and the power amplifier 24.

Subsequently, the control unit 40 switches the tone control circuit 16 to the zero-gain state according to the setting data SD4 thus received.

Let us say that, subsequently, the user switches on the loudness function. In this case, the control circuit 40 receives, as the input data, the setting data SD5 which is an instruction to switch the loudness circuit 18 (BLK5) to the ON state (time point t7). The control unit 40 switches the state of the loudness circuit 18 according to the setting data SD5. Subsequently, over the soft start period Tss from the time point t8 to the time point t9, the control unit 40 softly switches the state of the soft switch circuit 30 from the state in which the second input terminal P2 is selected to the state in which the first input terminal P1 is selected. As a result, the audio signal is seamlessly switched from the flat output state in which the loudness processing (and additional processing) is not performed, to the state in which the loudness function is executed so as to enhance the bass range.

The above is the operation of the signal processing system 100.

With the signal processing system 100 according to the present embodiment, the i-th through j-th (fourth through seventh) processing blocks BLK4 through BLK7 can be bypassed by instructing the soft switch circuit 30 to select the signal input via the second input terminals, thereby suppressing signal degradation. Specifically, in the state in which such unnecessary blocks are bypassed, the audio signal is input to the speakers SP only via the input selector circuit 11, the input gain control circuit 12, the volume circuit 14, and the power amplifier 24. This halves the number of buffer blocks.

Furthermore, the soft switch circuit 30 is capable of seamlessly switching the input terminal from one input terminal P1 to the other input terminal P2 (or the reverse). Thus, such an arrangement prevents noise from occurring when the bypass line is switched. Furthermore, such an arrangement is capable of softly switching the effect processing for the audio signal.

Description has been made regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Description has been made in the embodiment regarding an arrangement in which a single bypass line 26 is provided which enables the fourth through seventh processing blocks BLK4 through BLK7 to be bypassed. However, the present invention is not restricted to such an arrangement.

For example, another bypass line which enables only the tone control circuit 16 to be bypassed may be provided, in addition to or instead of the bypass line 26 shown in FIG. 7. The tone control circuit is more likely to have a signal distortion effect than the other blocks. Thus, such an arrangement is capable of providing high sound quality by bypassing the tone control circuit.

A bypass line configured to bypass only the high-pass filter 20 may be provided, in addition to or instead of the aforementioned bypass lines. Whether the high-pass filter 20 is to be set to the ON state or the OFF state is determined based upon the presence or absence of the subwoofer. Accordingly, in many cases, the high-pass filter is fixedly to a single state, i.e., the ON state or the OFF state. By providing a function of bypassing the high-pass filter, such an arrangement provides improved sound quality in the system including no subwoofer.

From another perspective, the (i−1)-th processing block may be a volume circuit which amplifies the audio signal with a gain that corresponds to the value set by the user. With such an arrangement, the audio signal always passes through the volume circuit, thereby allowing the user to adjust at least the sound volume. Also, the (j+1)-th processing block may be a power amplifier which amplifies the audio signal, and outputs the audio signal thus amplified to the speakers SP.

Also, the control unit 40 may receive, from an external circuit, a dedicated control signal which designates the state of the soft switch circuit 30. The control unit 40 may control the soft switch circuit 30 according to the control signal thus received.

Such an arrangement allows the switching timing for switching the soft switch circuit 30, etc., to be controlled from an external host processor in a flexible manner.

Description has been made in the embodiment regarding an arrangement which processes an audio signal. Also, the present invention can be applied to an arrangement which processes an analog signal such as an image signal.

Third and Fourth Embodiments 3.1 Background

In order to adjust the frequency characteristics of an audio signal, various signal processing circuits such as a tone control circuit, an equalizer, a bass range enhancement circuit (loudness circuit), etc., are employed. In general, such a signal processing circuit includes a filter and a variable gain amplifier (attenuator) connected sequentially (see Patent document 1).

Figure 9:
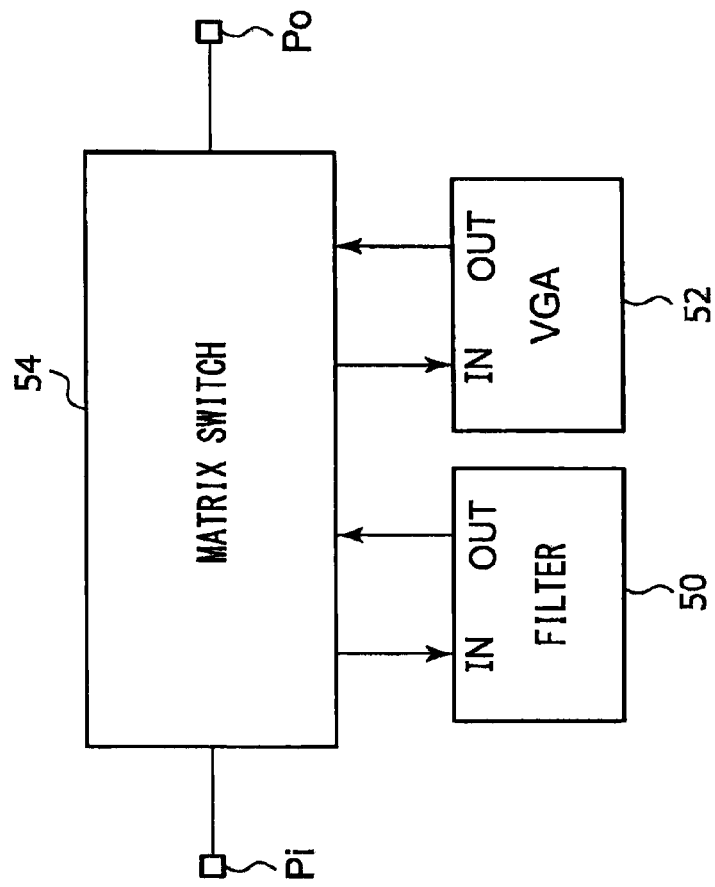
FIG. 9 is a circuit diagram which shows a configuration of an audio signal processing circuit according to a third embodiment.

A tone control circuit shown in FIG. 9 in Patent document 1 includes: a gain control means (4) configured to amplify an input signal (Vi); a transfer function means, i.e., a filter (5) configured to perform filtering on the output signal (Vk) of the gain control means (4); and a calculation means (2) configured to combine the output signal Vf of the transfer function means (5) and the input signal (Vi).

[Patent Document]

Japanese Patent Application Laid Open No. H7-263988

3.2 Problem

The frequency band range of the audio signal is from several Hz to several tens of kHz. Accordingly, in order to configure a filter (5) that functions effectively over such a frequency band range, there is a need to increase the capacitance of a capacitor, or to increase the resistance of a resistor. However, in a case in which such a filter is included in a semiconductor integrated circuit in the form of a built-in component, the capacitance of the capacitor is limited by the circuit area. Accordingly, there is a need to increase the resistance of the filter. However, increased resistance leads to an increase in thermal noise that occurs in the filter. Furthermore, in a case in which the filter (5) has a configuration including a capacitor, a resistor, and a differential pair of bipolar transistors, the base current flows through a large resistance, leading to offset occurring at the amplifier. In a case in which the configuration of the amplifier includes MOSFETs in order to solve such a problem, flicker noise occurs. Alternatively, in a case in which a switched-capacitor filter is employed, switching noise occurs.

Accordingly, the tone control circuit described in Patent Document 1 has a problem in that the noise that occurs at the filter and processed by the calculation means (2) is superimposed on the output signal Vo. Furthermore, the technique described in Patent Document 1 has a problem of noise that occurs when the frequency band or the gain is switched.

With a circuit configured to process an audio signal, in some cases, there is a need to reduce noise, and in some cases, there is a need to switch the frequency band or gain without generating noise. Accordingly, there is a demand for a signal processing circuit configured to support such functions in a flexible manner.

An embodiment of the present invention has been made in order to solve such a problem. Accordingly, it is an exemplary purpose of the present invention to provide a technique for reducing noise. Description will be made in the following third and fourth embodiments regarding this technique.

Third Embodiment

FIG. 9 is a circuit diagram which shows a configuration of an audio signal processing circuit 100 according to a third embodiment. The audio signal processing circuit 100 performs signal processing on an audio signal input via an input port Pi, and outputs the audio signal thus processed via an output port Po. The audio signal processing circuit 100 includes a filter 50, a variable gain amplifier 52, and a matrix switch circuit 54.

The filter 50 performs filtering on the audio signal input via its input terminal IN. The filter 50 is a low-pass filter, a high-pass filter, a bandpass filter, a band-rejection filter, or the like. The filter 50 may be provided as a fixed filter. Also, the filter 50 may be configured such that its frequency characteristics can be switched as desired.

The variable gain amplifier 52 amplifies or attenuates, with a gain set beforehand, an audio signal input via the input terminal IN. That is to say, the gain of the variable gain amplifier 52 can be switched in a range from a lowermost value which is smaller than 1 (attenuation) to an uppermost value which is greater than 1 (amplification).

The matrix switch circuit 54 is connected to the input port Pi, the output port Po, the input terminal IN and the output terminal OUT of the filter 50, and the input terminal IN and the output terminal OUT of the variable gain amplifier 52. The matrix switch circuit 54 includes multiple switches (not shown) in the form of built-in components, and is configured to allows the state to be switched between the following first state $\phi 1$ and second state $\phi 2$.

First state $\phi 1$: The state in which the input port Pi, the variable gain amplifier 52, the filter 50, and the output port Po are connected in series in this order.

Second state $\phi 2$: The state in which the input port Pi, the filter 50, the variable gain amplifier 52, and the output port Po are connected in series in this order.

With the filter 50 as "F", and the variable gain amplifier 52 as "A", the first state $\phi 1$ is represented by "Pi-A-F-Po", and the second state $\phi 2$ is represented by "Pi-F-A-Po".

Figure 10:
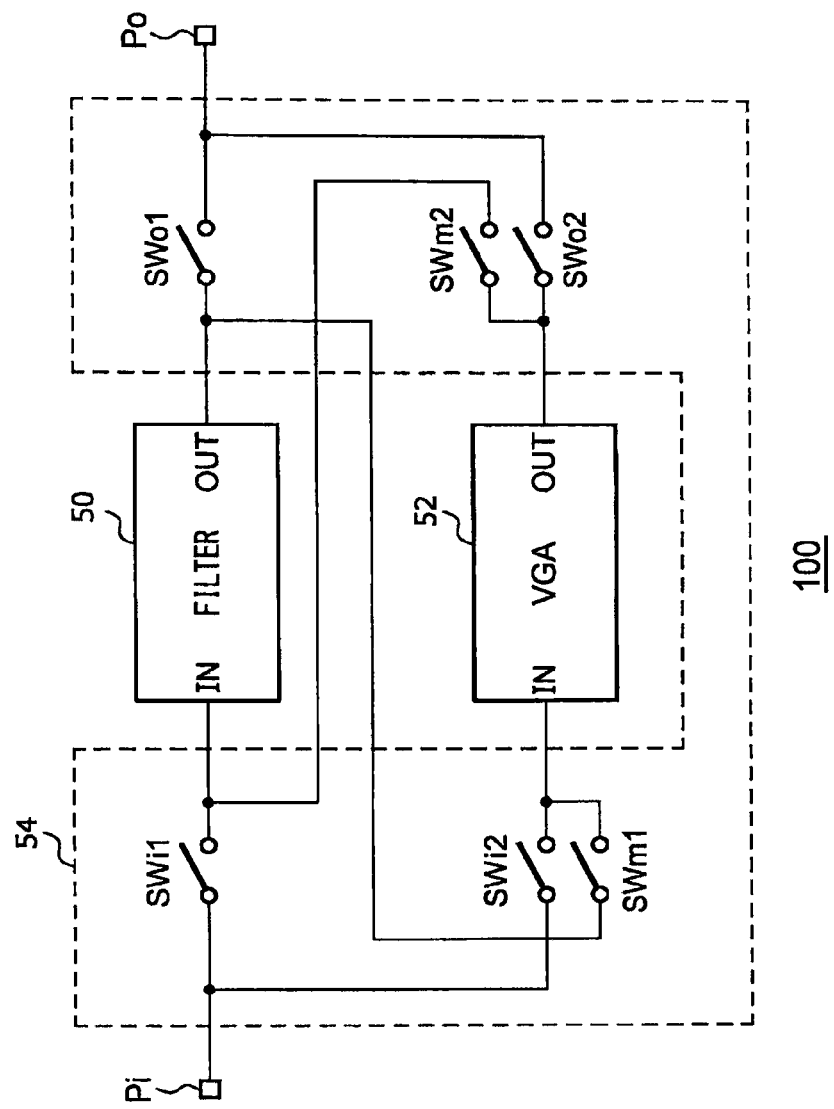
FIG. 10 is a circuit diagram which shows an example configuration of a matrix switch circuit shown in FIG. 9.

FIG. 10 is a circuit diagram which shows an example configuration of the matrix switch circuit 54 shown in FIG. 9. The matrix switch circuit 54 includes a first input switch SWi1, a second input switch SWi2, a first intermediate switch SWm1, a second intermediate switch SWm2, a first output switch SWo1, and a second output switch SWo2.

The first input switch SWi1 is arranged between the input port Pi and the input terminal IN of the filter 50. The second input switch SWi2 is arranged between the input port Pi and the input terminal IN of the variable gain amplifier 52.

The first intermediate switch SWm1 is arranged between the output terminal OUT of the filter 50 and the input terminal IN of the variable gain amplifier 52. The second intermediate switch SWm2 is arranged between the output terminal OUT of the variable gain amplifier 52 and the input terminal IN of the filter 50.

The first output switch SWo1 is arranged between the output terminal OUT of the filter 50 and the output port Po. The second output switch SWo2 is arranged between the output port OUT of the variable gain amplifier 52 and the output port Pout.

It should be noted that, in the following drawings, multiple switches each of which has one terminal connected to the same terminal may be configured using a selector circuit (multiplexer or demultiplexer) having the equivalent function.

In the circuit shown in FIG. 10, the first state $\phi 1$ and the second state $\phi 2$ are each associated with the states of the switches as follows.

First State $\phi 1$
Swi1=OFF, SWi2=ON
SWm1=OFF, SWm2=ON
SWo1=ON, SWo2=OFF

Second State $\phi 2$
Swi1=ON, SWi2=OFF
SWm1=ON, SWm2=OFF
SWo1=OFF, SWo2=ON

Figure 11:
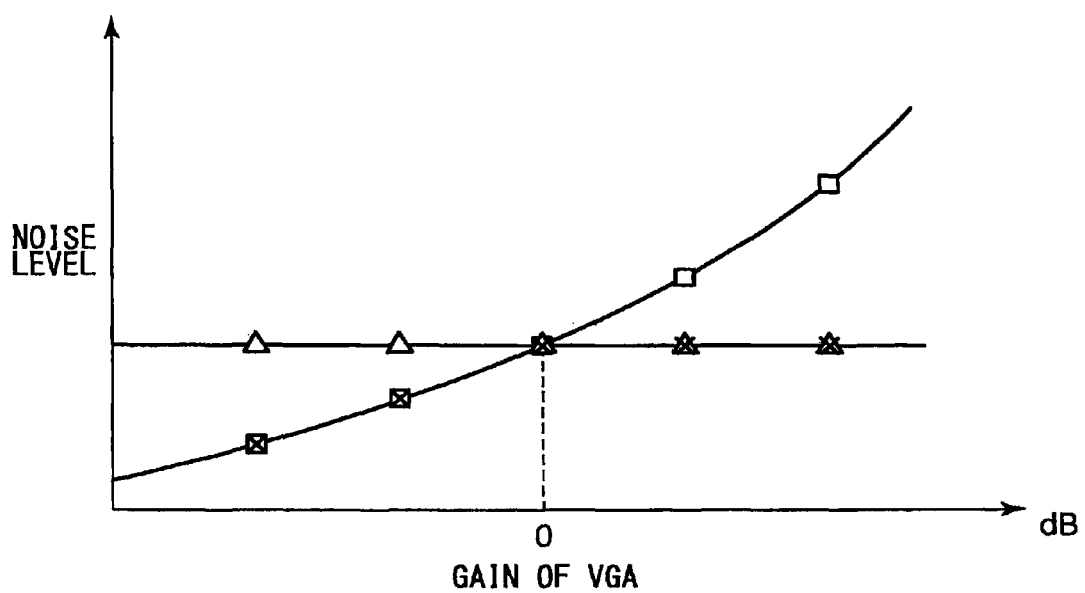
FIG. 11 is a graph which shows the noise properties of the audio signal processing circuit shown in FIG. 9 and FIG. 10.

FIG. 11 is a graph which shows the noise characteristics of the audio signal processing circuit 100 shown in FIG. 9 and FIG. 10. The vertical axis represents the amount of noise, and the horizontal axis represents the gain of the variable gain amplifier 52.

The values plotted as triangles represent the noise characteristics in the first state $\phi 1$, and the values plotted as squares represent the noise characteristics in the second state $\phi 2$.

Let us consider a case in which the noise that occurs at the variable gain amplifier 52 is sufficiently less than the noise that occurs at the filter 50. In this case, in the first state $\phi 1$ (plotted as triangles) in which the variable gain amplifier 52 is arranged as a component upstream of the filter 50, the noise output from the audio signal processing circuit 100 is approximately the same as the noise generated by the filter 50. Accordingly, the noise is output at an approximately constant level independent of the gain of the variable gain amplifier 52.

On the other hand, in the second state φ2 (plotted as squares) in which the variable gain amplifier 52 is arranged as a component downstream of the filter 50, the noise that occurs at the filter 50 is amplified or attenuated by the variable gain amplifier 52. Accordingly, as the gain of the variable gain amplifier 52 is raised, the amount of noise becomes larger, and as the gain is lowered, the amount of noise becomes smaller. The overall amount of noise output from the audio signal processing circuit 100 in the first state φ1 and the overall amount of noise output in the second state φ2 are the same when the gain of the variable gain amplifier 52 is set to 0 dB.

In such a situation, from the perspective noise reduction, it is advantageous to switch the state of the audio signal processing circuit 100 according to the gain of the filter 50. That is to say, as shown by the values plotted as x's in FIG. 11, when the gain of the variable gain amplifier 52 is greater than a predetermined threshold value (with a threshold of 0 dB as shown in FIG. 11, gain=1), the audio signal processing circuit 100 is set to the first state φ1. When the gain is smaller than the threshold value, the audio signal processing circuit 100 is set to the second state φ2. Such an arrangement reduces noise as compared with an arrangement in which the state is fixedly set to the first state φ1 or the second state φ2.

Furthermore, in a case in which the cutoff frequency band of the filter includes the frequency band of the noise that occurs at the variable gain amplifier 52 in the first state φ1, the noise that occurs at the variable gain amplifier 52 can be cut by the filter 50 provided as a downstream component, thereby providing reduced noise.

Also, even in a case in which the noise characteristics of the variable gain amplifier 52 and the filter 50 are different from those shown in FIG. 11, such an arrangement is capable of switching the state between the first state φ1 and the second state φ2 so as to reduce the overall noise that occurs in the audio signal processing circuit 100.

Description will be made under the assumption that the state is switched between the first state φ1 and the second state φ2 according to the gain of the variable gain amplifier 52, specifically, that when the gain is greater than 0 dB, the state is set to the first state φ1, and when the gain is smaller than 0 dB, the state is set to the second state φ2. It should be noted that the present invention is not restricted to such an arrangement. Also, the configuration of states and the gains may be set as desired.

Next, description will be made regarding the switching operation for switching the state between the first state φ1 and the second state φ2. In FIGS. 9 and 10, the matrix switch circuit 54 is preferably configured to be capable of seamlessly switching the state between the first state φ1 and the second state φ2, i.e., softly switching the state such that there are no discontinuities in the signal output via the output port Po. The seamless switching operation can be realized using the so-called "soft-switching" techniques, as they are called in the audio signal processing field. The soft-switching technique is employed in volume circuits, equalizer circuit, etc., to suppress the noise which is referred to as pop-up noise (popping).

Figure 12:
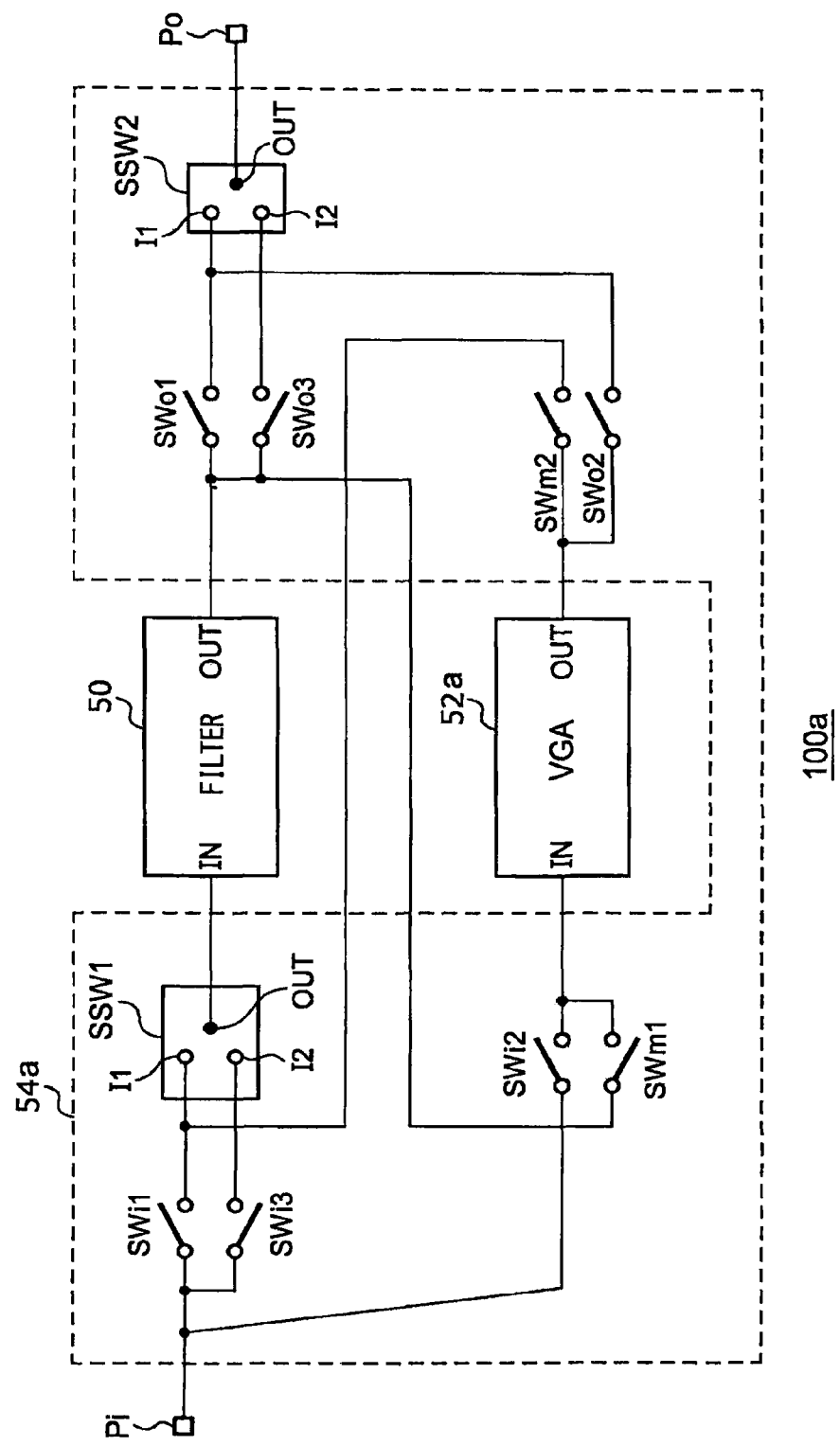
FIG. 12 is a circuit diagram which shows a first example configuration of an audio signal processing circuit which is capable of performing a soft switching operation.
Figure 13:
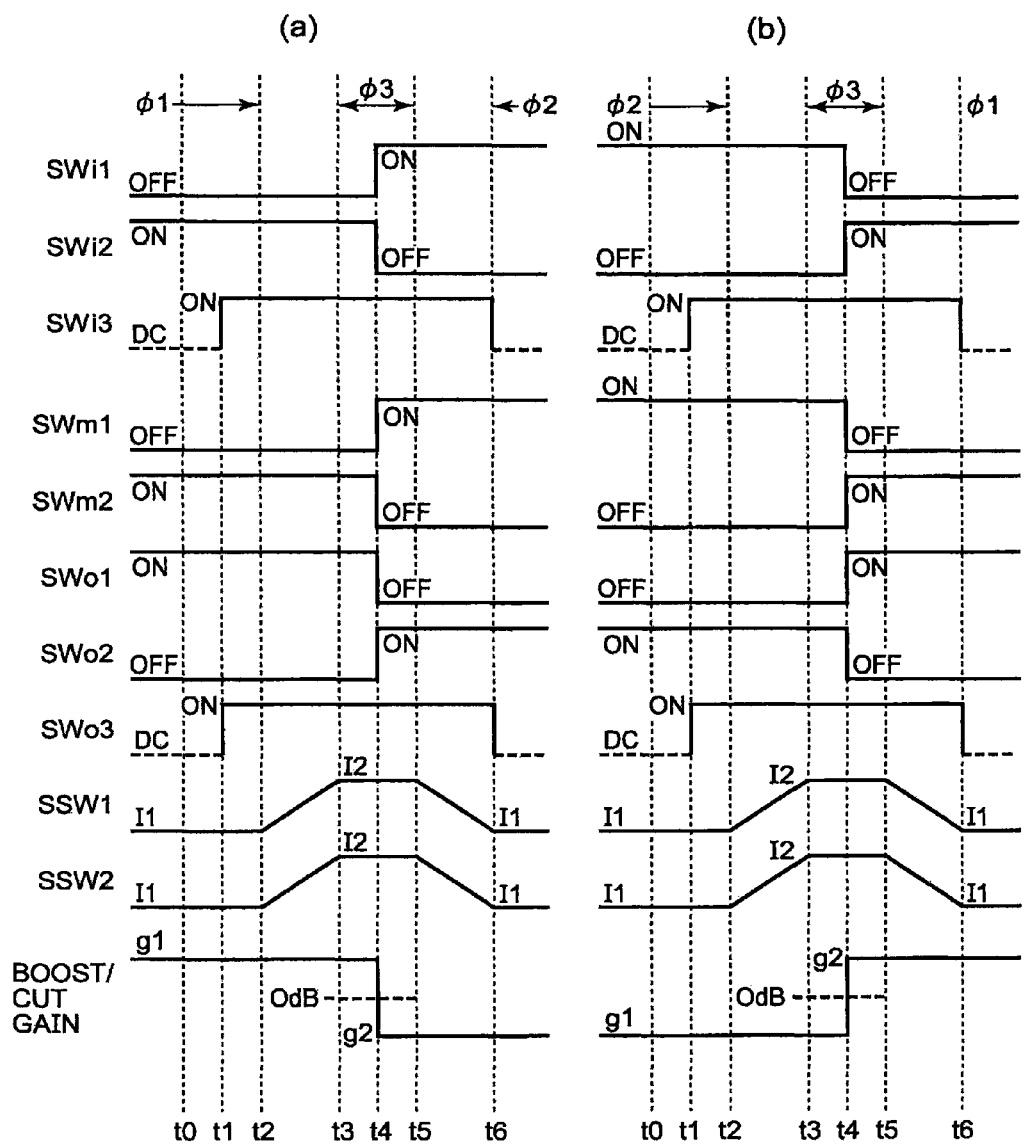
FIGS. 13A and 13B are time charts which show the state switching operations of the audio signal processing circuit shown in FIG. 12.

For example, the soft switching function can be realized by the following configuration. FIG. 12 is a circuit diagram which shows a first example configuration of an audio signal processing circuit which is capable of performing the soft-switching operation.

An audio signal processing circuit 100a is capable of setting the state to the following bypass state φ3, in addition to the first state φ1 and the second state φ2.

Bypass state φ3: The state in which the input port Pi, the filter 50, and the output port Po are connected in series in this order.

The third state φ3 is represented by "Pi-F-Po".

In order to support these three states, and in order to enable the state to be seamlessly switched between two desired states, the matrix switch circuit 54a further includes two soft switches SSW1 and SSW2, a third input switch SWi3, and a third output switch SWo3, in addition to the components of the matrix switch circuit 43 shown in FIG. 10.

The first soft switch circuit SSW1 and the second soft switch circuit SSW2 each include a first input terminal I1, a second input terminal I2 (hollow circle), and an output terminal OUT (solid circle). Each soft switch circuit selects either the signal input via the first input terminal I1 or the second input terminal I2, and outputs the signal thus selected via the output terminal OUT. The first soft switch circuit SSW1 and the second soft switch circuit SSW2 each softly switches the signal output via its output terminal OUT from the signal input via one input terminal I1 (I2) to the signal input via the other input terminal I2 (I1).

The output terminal OUT of the first soft switch circuit SSW1 is connected to the input terminal IN of the filter 50. The first input switch SWi1 is provided between the input port Pi and the first input terminal I1 of the first soft switch circuit SSW1. The second input switch SWi2 is provided between the input port Pi and the input terminal IN of the variable gain amplifier 52a. The third input switch SWi3 is provided between the input port Pi and the second input terminal I2 of the first soft switch circuit SSW1.

A first intermediate switch SWm1 is provided between the output terminal OUT of the filter 50 and the input terminal IN of the variable gain amplifier 52a. A second intermediate switch SWm2 is provided between the output terminal OUT of the variable gain amplifier 52a and the first input terminal I1 of the first soft switch circuit SSW1.

The first output switch SWo1 is provided between the output terminal OUT of the filter 50 and the first input terminal I1 of the second soft switch circuit SSW2. The second output switch SWo2 is provided between the output terminal OUT of the variable gain amplifier 52a and the first input terminal I1 of the second soft switch circuit SSW2. The third output switch SWo3 is provided between the output terminal OUT of the filter 50 and the second input terminal I2 of the second soft switch circuit SSW2.

In the circuit shown in FIG. 12, the first state φ1, the second state φ2, and the third state φ3 correspond to the respective states of the switches. "DC" is a redundant term (Don't Care) which represents "regardless of ON or OFF". Also, it can be understood that the equivalent circuit states can be provided by other combinations of the switches, in addition to the following combinations shown as an example.

The First State φ1
SWi1=OFF, SWi2=ON, SWi3=DC,
SWm1=OFF, SWm2=ON,
SWo1=ON, SWo2=OFF, SWo3=DC,
SSW1=I2, SSW2=I1.

The Second State φ2
SWi1=ON, SWi2=OFF, SWi3=DC,
SWm1=ON, SWm2=OFF,
SWo1=OFF, SWo2=ON, SWo3=DC,
SSW1=I1, SSW2=I1.

The Third State φ3
SWi1=DC, SWi2=DC, SWi3=ON,
SWm1=DC, SWm2=DC,
SWo1=DC, SWo2=DC, SWo3=ON,
SSW1=I2, SSW2=I2.

The above is the configuration of the matrix switch circuit 54a. Next, description will be made regarding the operation of the audio signal processing circuit 100a shown in FIG. 12.

With the audio signal processing circuit 100a, the state can be seamlessly switched between two states.

(1) First state φ1→Second state φ2
(2) Second state φ2→First state φ1

Description will be made regarding each switching operation. FIGS. 13A and 13B are time charts which show the state switching operations of the audio signal processing circuit 100a shown in FIG. 12. The time chart shows the ON/OFF state of each switch, the state of each soft switch circuit, and the gain of the variable gain amplifier 52a, in this order, beginning from the top of the time chart.

(1) First State φ1→Second State φ2

Description will be made with reference to FIG. 13A. Before the time point t0, the gain of the variable gain amplifier 52a is set to a first value g1 which is greater than 0 dB. The first value g1 is set to 3 dB, for example. In this case, the variable gain amplifier 52a amplifies an audio signal. In this stage, the audio signal processing circuit 100a is set to the first state φ1.

At the time point t0, an instruction is input to the audio signal processing circuit 100a to switch the gain of the variable gain amplifier 52a to a second value g2 (e.g., −3 dB) which is smaller than 0 dB. That is to say, an instruction is input to switch the state to the second state φ2. The switching operation is executed via the following steps.

At the time point t1, the third input switch SWi3 and the third output switch SWo3 are each set to the ON state (S1).

Subsequently, in the period from the time point t2 to the time point t3, the first soft switch circuit SSW1 and the second soft switch circuit SSW2 are each softly switched from the state in which the first input terminal I1 side is selected to the state in which the second input terminal I2 side is selected (S2).

During the period from the time point t3 to the time point t5, the state is set to the third state φ3. At the time point t4 in the period of the third state φ3, the gain of the variable gain amplifier 52a is switched from the first value g1 to the second value g2. Furthermore, the first input switch SWi1 is switched to the ON state, the second input switch SWi2 is switched to the OFF state, the first intermediate switch SWm1 is switched to the ON state, the second intermediate switch SWm2 is switched to the OFF state, the first output switch SWo1 is switched to the OFF state, and the second output switch SWo2 is switched to the ON state (S3).

In the third state φ3, the variable gain amplifier 52a is bypassed. Accordingly, switching the gain has no effect on the output signal. Furthermore, the switching operations for the other switches have no effect on the output signal.

Subsequently, over the period from the time point t5 to the time point t6, the state is softly switched from the state in which the first soft switch circuit SSW1 and the second soft switch circuit SSW2 each select the second input terminal side I2 to the state in which they each select the first input terminal I1 side.

After the time point t6, the audio signal processing circuit 100a is set to the second state φ2, and the audio signal processed by the filter 50 and the variable gain amplifier 52 in this order is output via the output port Po.

As described above, with the audio signal processing circuit 100a shown in FIG. 12, the sequencing of the filter 50 and the variable gain amplifier 52a can be switched without involving noise due to the state switching operation.

(2) Second State φ2→First State φ1

The switching operation for switching the state from the second state φ2 to the first state φ1 can be performed in the same way. That is to say, as shown in FIG. 13B, the state of each switch is switched in the opposite sequencing of the switching operation shown in FIG. 13A.

Furthermore, the audio signal processing circuit 100a is capable of executing: (1) seamless gain switching operation for switching the gain of the variable gain amplifier 52 in the first state φ1; and (2) seamless gain switching operation for switching the gain of the variable gain amplifier 52 in the second state φ2. Description will be made below regarding such switching processing.

(3) First State φ1→First State φ1

In the initial state, the gain of the variable gain amplifier 52a is set to the first value g1, which is greater than 0 dB. The first value g1 is set to +3 dB, for example. In this state, the variable gain amplifier 52 amplifies an audio signal. In this stage, the audio signal processing circuit 100a is in the first state φ1. Subsequently, an instruction is input to the audio signal processing circuit 100a to switch the gain of the variable gain amplifier 52a to the second value g2 (e.g., +5 dB), which is greater than 0 dB. After the gain switching operation, the state remains in the first state φ1.

Such a switching operation as shown in the time chart in FIG. 13a can be performed by switching only the soft switch circuits SSW1 and SSW2 and the switches SWi3 and SWo3, without switching the states of the other switches SWi1 and SWi2, SWm1 and SWM2, and SWo1 and SWo2, i.e., while the states of these other switches remain fixed.

That is to say, upon receiving an instruction to switch the gain, the third input switch SWi3 and the third output switch SWo3 are each switched to the ON state (S1).

Subsequently, the first soft switch circuit SSW1 and the second soft switch circuit SSW2 are each softly switched from the state in which the first input terminal I1 side is selected to the state in which the second input terminal I2 side is selected (S2).

The period from the time point t3 to the time point t5 corresponds to the third state φ3. In the third state φ3, the gain of the variable gain amplifier 52a is switched from the first value g1 to the second value g2. The states of the other switches remains fixed. In the third state φ3, the variable gain amplifier 52a is bypassed. Thus, such a gain switching operation has no effect on the output signal.

Subsequently, over the period from the time point t5 to the time point t6, the first soft switch circuit SSW1 and the second soft switch circuit SSW2 are each softly switched from the state in which the second input terminal I2 side is selected to the state in which the first input terminal I1 side is selected (S4).

After the time point t6, the audio signal processing circuit 100a is set to the first state φ1 again, thereby outputting, via the output port Po, an audio signal processed by the variable gain amplifier 52 and the filter 50 in this order.

(4) Second State φ2→Second State φ2

The gain switching operation in the second state φ2 is executed in the same way as in (3). That is to say, such a gain switching operation can be performed by switching only the soft switch circuits SSW1 and SSW2 and the switches SWi3 and SWo3, without switching the states of the other switches SWi1 and SWi2, SWm1 and SWM2, and SWo1 and SWo2, i.e., while the states of these other switches remain fixed.

It should be noted that, in the gain switching operation in (3), the switching operation is performed in order of the first state φ1, the third state φ3, and the first state φ1. Such a gain switching operation can be performed without any problem for a case in which the gain is repeatedly switched in increments of the smallest steps (e.g., in increments of 1 dB steps), or in a case in which a band-rejection filter (e.g., a sampling clock removal filter) configured to remove a band other than the audio band or the like is switched. On the other hand, in a case in which the gain is switched in increments of relatively large steps, the overall gain of the audio signal processing circuit 100 is switched in order of g1 (=3 dB), 0 dB (Bypass state), and g2 (=5 dB), for example. Such a gain switching operation leads to fluctuations in the audio signal in a certain frequency band over time, which, in some cases, can lead to the user experiencing uncomfortable auditory sensations. A similar problem can occur in the gain switching operation described in (4).

Description will be made regarding an embodiment configured to solve such a problem.

The configuration obtained by eliminating the third input switch SWi3 and the third output switch SWo3 from the circuit shown in FIG. 12 also operates effectively.

Figure 14:
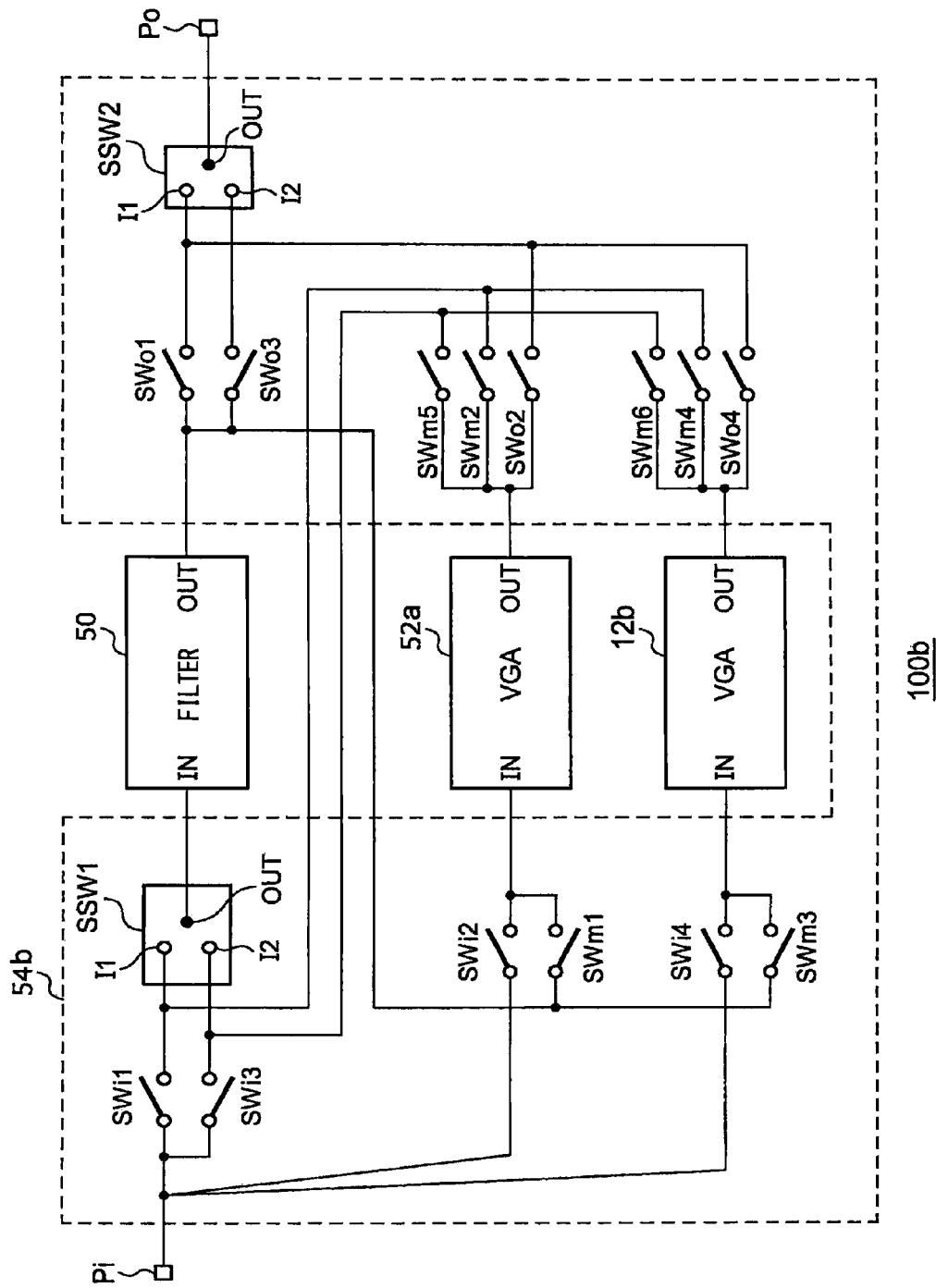
FIG. 14 is a circuit diagram which shows a second example configuration of an audio signal processing circuit which is capable of performing a soft switching operation.

FIG. 14 is a circuit diagram which shows a second example configuration of an audio signal processing circuit which is capable of performing a soft switching operation.

An audio signal processing circuit 100b shown in FIG. 14 includes a pair of variable gain amplifiers (12a and 12b). One variable gain amplifier will simply be referred to as "variable gain amplifier 52a". On the other hand, the other variable gain amplifier will be referred to as "replica variable gain amplifier 52b".

With the filter 50 as "F", with the variable gain amplifier 52a as "A", with the replica variable gain amplifier 52b as "B", with the input port Pi as "Pi", and with the output port Po as "Po", the audio signal processing circuit 100b is configured to be capable of switching the state between the following five connection states.

First output state $\phi 1o$ [Pi-A-F-Po]
First intermediate state $\phi 1m$: [Pi-B-F-Po]
Second output state $\phi 2o$: [Pi-F-A-Po]
Second intermediate state $\phi 2m$: [Pi-F-B-Po]
Bypass state $\phi 3$: [Pi-F-Po]

The first output state $\phi 1o$ corresponds to the aforementioned first state $\phi 1$. In this state, the audio signal input via the input port Pi is processed by the variable gain amplifier 52a and the filter 50 in this order, and the audio signal thus processed is output via the output port Po. The first output state $\phi 1o$ is used when an audio signal is reproduced normally.

In the first intermediate state $\phi 1m$, the audio signal input via the input port Pi is processed by the replica variable gain amplifier 52b and the filter 50 in this order, and the audio signal thus processed is output via the output port Po. The first intermediate state $\phi 1m$ is not used to reproduce an audio signal normally, and is primarily used for an intermediate state in which the state is switched.

The second output state $\phi 2o$ is a state that corresponds to the aforementioned second state $\phi 2$. In this state, the audio signal input via the input port Pi is processed by the filter 50 and the variable gain amplifier 52a in this order, and the audio signal thus processed is output via the output port Po.

In the second intermediate state $\phi 2m$, the audio signal input via the input port Pi is processed by the filter 50 and the replica variable gain amplifier 52b in this order, and the audio signal thus processed is output via the output port Po. The second intermediate state $\phi 2m$ is not primarily used to reproduce an audio signal normally. The second intermediate state $\phi 2m$ is primarily used in the intermediate state in which the state is switched.

In the bypass state $\phi 3$, the audio signal input via the input port Pi is only processed by the filter 50, and the audio signal thus processed is output via the output port Po. Also, the bypass state $\phi 3$ is not primarily used to reproduce an audio signal normally. The bypass state $\phi 3$ is primarily used for the intermediate state in which the state is switched.

However, as described later, the first intermediate state $\phi 1m$ and the second intermediate state $\phi 2m$ can each be used to reproduce an audio signal normally. In this case, the first output state $\phi 1o$ and the second output state $\phi 2o$ are each used for the intermediate state in which the state is switched.

In order to provide these five states, a matrix switch circuit 54b is configured as follows. Here, description will be made only regarding the points of difference from the matrix switch circuit 54a.

The matrix switch circuit 54b shown in FIG. 14 further includes a fourth input switch SWi4, a third intermediate switch SWm3 through a sixth intermediate switch SWm6, and a fourth output switch SWo4, in addition to the components of the matrix switch 54a shown in FIG. 12.

The fourth input switch SWi4 is provided between the input port Pi and the input terminal IN of the replica variable gain amplifier 52b.

The third intermediate switch SWm3 is provided between the output terminal OUT of the filter 50 and the input terminal IN of the replica variable gain amplifier 52b. The fourth intermediate switch SWm4 is provided between the output terminal OUT of the replica variable gain amplifier 52b and the first input terminal I1 of the first soft switch circuit SSW1. The fifth intermediate switch SWm5 is provided between the output terminal OUT of the variable gain amplifier 52a and the second input terminal 12 of the first soft switch circuit SSW1. The sixth intermediate switch SWm6 is provided between the output terminal OUT of the replica variable gain amplifier 52b and the second input terminal 12 of the first soft switch circuit SSW1.

The fourth output switch SWo4 is provided between the output terminal OUT of the replica variable gain amplifier 52b and the first input terminal I1 of the second soft switch circuit SSW2.

The above is the configuration of the matrix switch circuit 54b. Next, description will be made regarding the operation of the audio signal processing circuit 100b shown in FIG. 14. The audio signal processing circuit 100b is capable of switching the state between the following four states.

(1) First output state $\phi 1o \rightarrow$ Second output state $\phi 2o$
(2) Second output state $\phi 2o \rightarrow$ First output state $\phi 1o$
(3a) Switching of the gain of the variable gain amplifier 52a in the first output state $\phi 1o$
(3b) Switching of the gain of the variable gain amplifier 52a in the second output state $\phi 2o$ Description will be made regarding each switching operation.

(1) First Output State $\phi 1o \rightarrow$ Second Output State $\phi 2o$
This switching operation is performed in the same way as the operation of the audio signal processing circuit 100a shown in FIG. 12.

(2) Second Output State $\phi 2o \rightarrow$ First Output State $\phi 1o$
This switching operation is performed in the same way as with the operation of the audio signal processing circuit 100a shown in FIG. 12.

Figure 15:
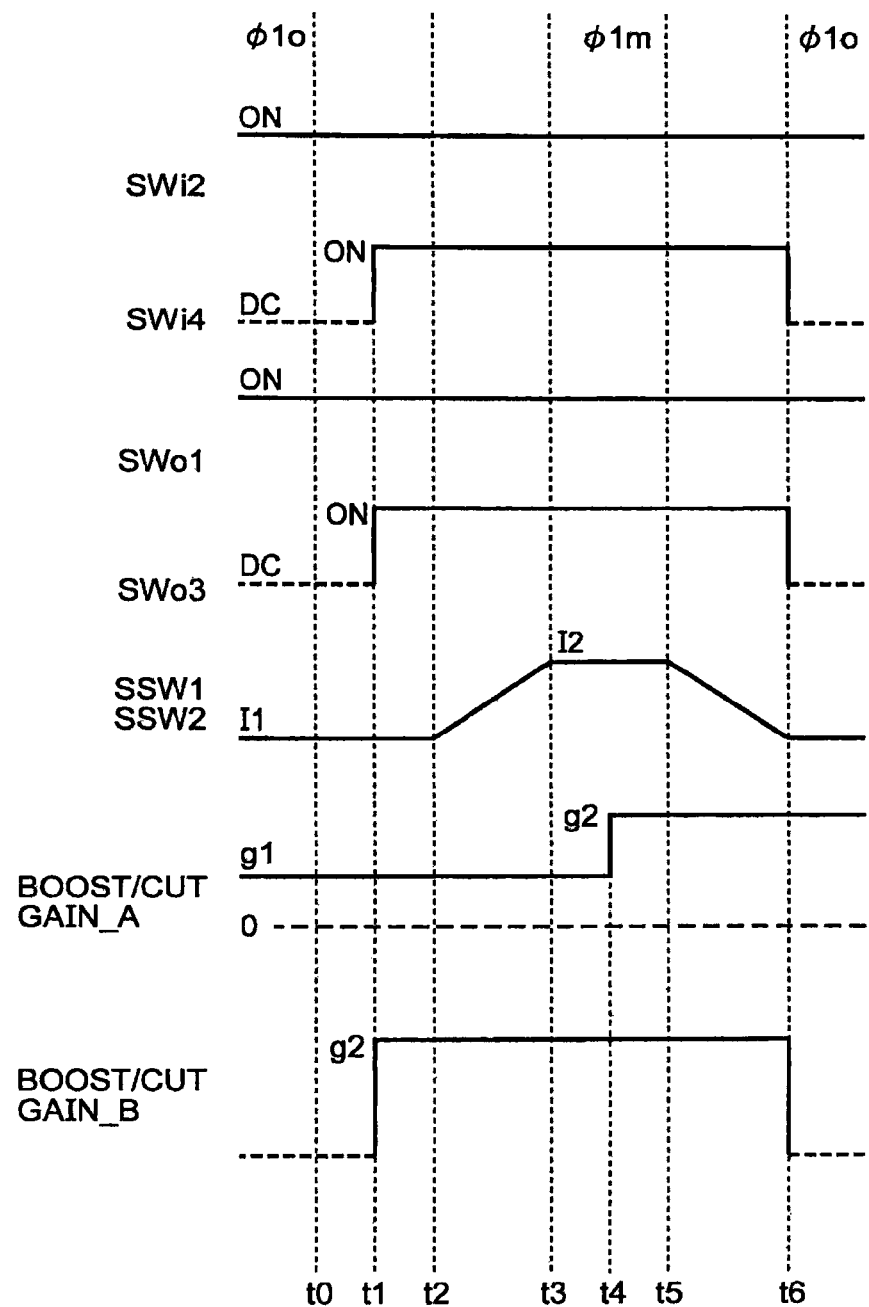
FIG. 15 is a time chart which shows the state switching operation of the audio signal processing circuit shown in FIG. 14.

(3a) First Output State $\phi 1o \rightarrow$ First Output State $\phi 1o$
FIG. 15 is a time chart which shows the state switching operation of the audio signal processing circuit 100b shown in FIG. 14. In the time chart, "GAIN_A" represents the gain of the variable gain amplifier 52a, "GAIN_B" represents the gain of the replica variable gain amplifier 52b.

In the initial state, the gain GAIN_A of the variable gain amplifier 52a is set to the first value g1 (e.g., 3 dB) which is greater than 0 dB. In this stage, the audio signal processing circuit 100b is set to the first state φ1. Subsequently, an instruction is input to the audio signal processing circuit 100b to switch the gain GAIN_A of the variable gain amplifier 52a to the second value g2 (e.g., +5 dB) which is greater than 0 dB. After the gain switching operation, the state remains in the first state φ1.

Upon receiving an instruction to switch the gain at the time point t0, the fourth input switch SWi4 and the third output switch SWo3 are each switched to the ON state at the time point t1 (S1). Furthermore, the gain GAIN_B of the replica gain amplifier 52b is set to the second value g2.

Subsequently, over the period from the time point t2 to the time point t3, the first soft switch circuit SSW1 and the second soft switch circuit SSW2 are each softly switched from the state in which the first input terminal I1 side is selected to the state in which the second input terminal I2 side is selected (S2).

The period from the time point t3 to the time point t5 corresponds to the first intermediate state φ1m. At the time point t4, the gain GAIN_A of the variable gain amplifier 52a is switched from the first value g1 to the second value g2. The states of the other switches remain fixed. In the first intermediate state φ1m, the variable gain amplifier 52a is bypassed. Thus, the gain switching operation thereof has no effect on the output signal.

Subsequently, over the period from the time point t5 to the time point t6, the first soft switch circuit SSW1 and the second soft switch circuit SSW2 are each softly switched from the state in which the second input terminal I2 side is selected to the state in which the first input terminal I1 side is selected (S4).

After the time point t6, the audio signal processing circuit 100b is returned to the first output state φ1o. In this state, the audio signal processed by the variable gain amplifier 52a and the filter 50 in this order is output via the output port Po.

As described above, with the audio signal processing circuit 100b shown in FIG. 14, the first intermediate state φ1m is employed instead of the third state φ3. Thus, such an arrangement is capable of switching the gain from the first value g1 to the second value g2 without involving the state in which the gain is set to 0 dB. This reduces the user's uncomfortable auditory sensations.

(4a) Second Output State φ2o→Second Output State φ2o

This switching operation can be performed in the same way as described in (3a). Accordingly, description thereof will be omitted.

It should be noted that, with the audio signal processing circuit 100b shown in FIG. 14, the state can be switched from the first output state φ1o to the second output state φ2o using the first intermediate state φ1m and the second intermediate state φ2m. Also, the audio signal processing circuit 100b is capable of performing a switching operation in the opposite sequencing of the aforementioned switching operation.

Figure 16:
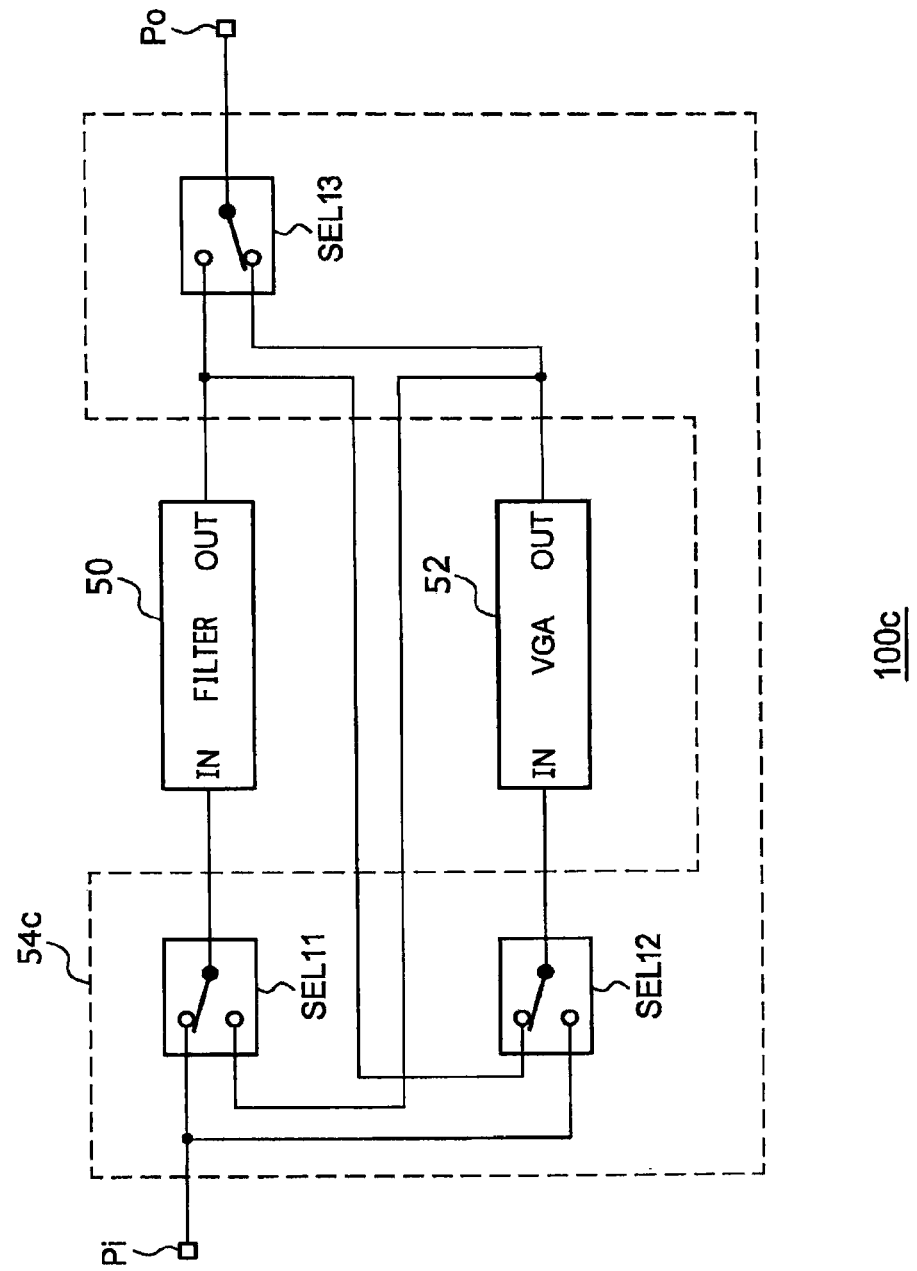
FIG. 16 is a circuit diagram which shows a modification of the audio signal processing circuit shown in FIG. 10.

FIG. 16 is a circuit diagram which shows a modification of the audio signal processing circuit shown in FIG. 10. An audio signal processing circuit 100c shown in FIG. 16 has the same configuration shown in FIG. 10 except for the configuration of the matrix switch circuit 54c. Specifically, the audio signal processing circuit 100c has a configuration obtained by replacing the two switch elements, the output terminals of which are connected together, with a selector circuit. A first selector SEL11 corresponds to the pair of switches SWi1 and SWm2 shown in FIG. 10. A second selector SEL12 corresponds to the pair of switches SWi2 and SWm1 shown in FIG. 10. A third selector SWL13 corresponds to the pair of switches SWo1 and SWo2 shown in FIG. 10. The connection state of the selectors SEL11 through SEL13 shown in FIG. 16 corresponds to the second state φ2. Also, another selector state that differs from that shown in FIG. 16 corresponds to the first state φ1. Such a modification is capable of switching the state between the first state and the second state.

Figure 17:
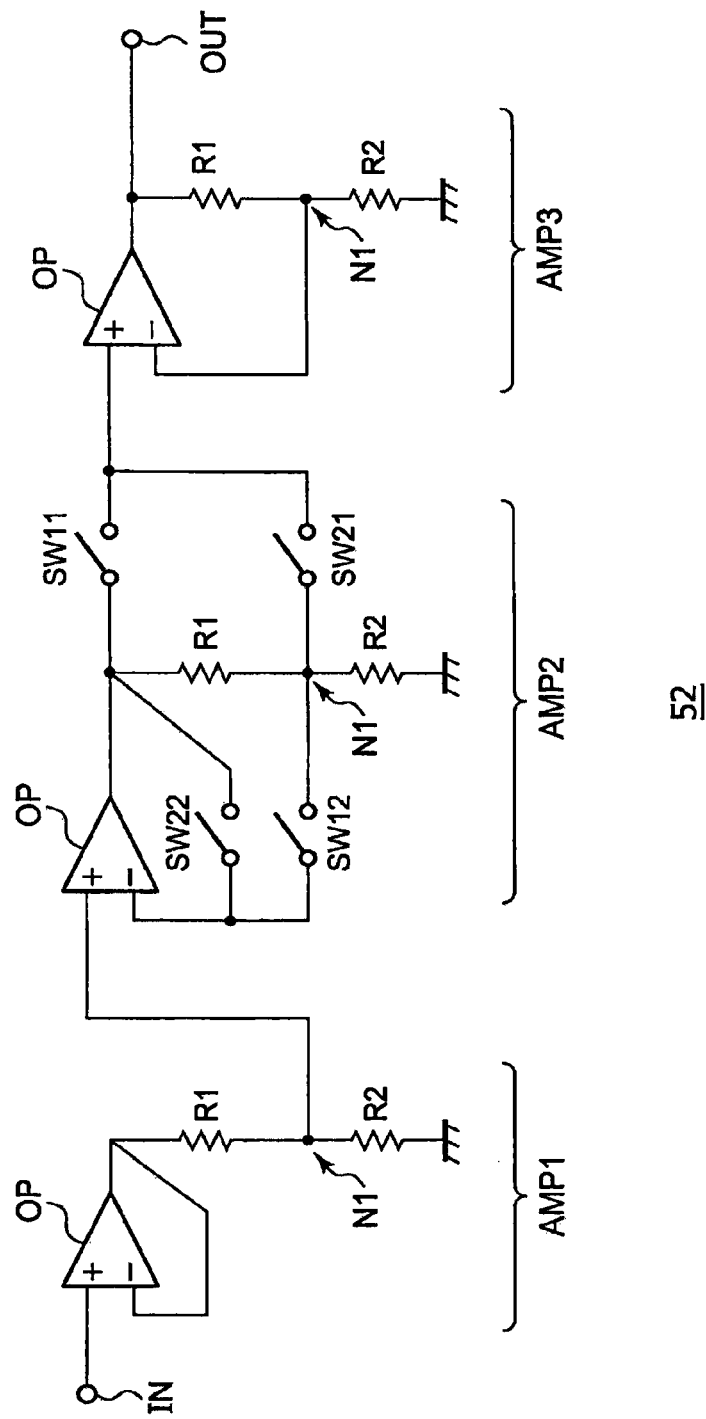
FIG. 17 is a circuit diagram which shows an example configuration of a variable gain amplifier which can be employed in the third embodiment.

FIG. 17 is a circuit diagram which shows an example configuration of the variable gain amplifier 52 which can be employed in the third embodiment. It should be noted that the configuration of the variable gain amplifier 52 is not restricted to the configuration shown in FIG. 17.

The variable gain amplifier 52 includes a first amplifier AMP1, a second amplifier AMP2, and a third amplifier AMP3. The first amplifier AMP1 through the third amplifier AMP3 each have the same configuration. Specifically, each amplifier includes an operational amplifier OP, a first resistor R1, and a second resistor R2. The first resistor R1 and the second resistor R2 are connected in series between the output terminal of the operational amplifier OP and the ground terminal. A signal output from the upstream component is input to the non-inverting input terminal of the operational amplifier OP. The electric potential that occurs at a connection node N1 that connects the two resistors R1 and R2 is input to the inverting terminal of the operational amplifier OP as a feedback signal.

The second amplifier AMP2, which is provided as an intermediate amplifier, further includes boost switches SW11 and SW12, and cut switches SW21 and SW22. The boost switch SW11 is provided in order to acquire the voltage that occurs at the output terminal of the operational amplifier OP. The cut switch SW21 is provided in order to acquire the electric potential that occurs at the connection node N1 that connects the two resistors R1 and R2.

Furthermore, the boost switch SW12 is provided between the connection node N1 and the inverting terminal of the operational amplifier OP. The cut switch SW22 is provided between the output terminal of the operational amplifier OP and the inverting terminal of the operational amplifier OP.

When the boost switches SW11 and SW12 are each set to the ON state, the variable gain amplifier 52 amplifies the entire audio signal, and when the cut switches SW21 and SW22 are each set to the ON state, the variable gain amplifier 52 attenuates the entire audio signal. In other words, the resistance value of the amplifier provided at each stage is determined so as to provided such processing. It should be noted that either the pair switches SW11 and SW21, or the pair of switches SW12 and SW22, or both pairs may be replaced by a selector. Also, the selector may be replaced by the aforementioned soft switch.

Figure 18:
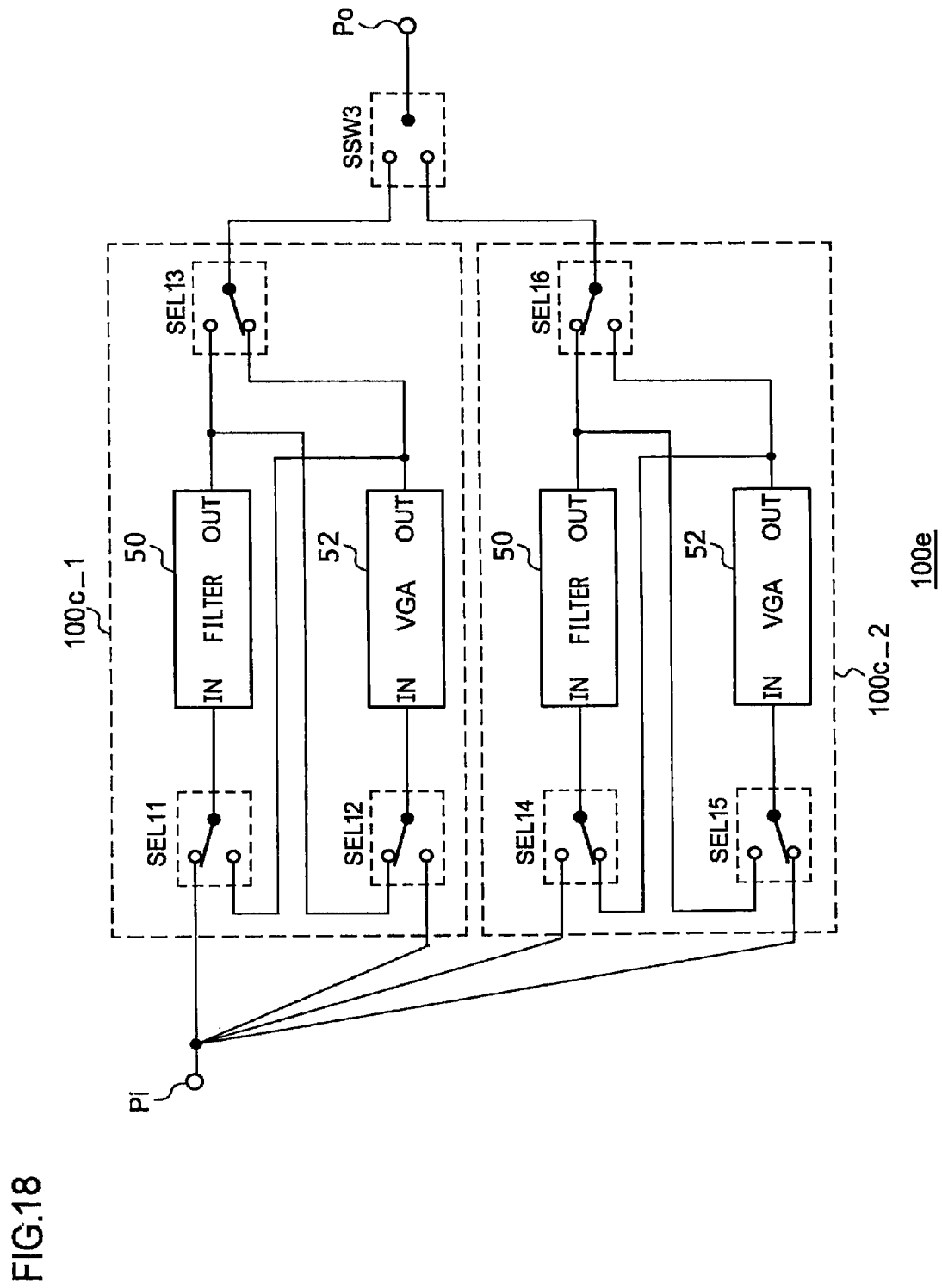
FIG. 18 is a circuit diagram which shows a modification of the audio signal processing circuit shown in FIG. 16.

FIG. 18 is a circuit diagram which shows a modification of the audio signal processing circuit shown in FIG. 16. An audio signal processing circuit 100e shown in FIG. 18 includes an audio signal processing circuits 100c_1 and 100c_2 and a soft switch SSW3. The audio signal processing circuits 100c_1 and 100c2 each have the same configuration as that of the audio signal processing circuit 100c shown in FIG. 16. The output signals of the audio signal processing circuits 100c1 and 100c2 are input to the third soft switch circuit SSW3.

Next, description will be made regarding the operation of the audio signal processing circuit 100e shown in FIG. 18. Here, description will be made regarding the switching of the state from the second state to the first state.

Step 1: In the initial state, the third soft switch circuit SSW3 selects the audio signal processing circuit 100c_1, which is provided as the first channel. That is to say, the first channel audio signal processing circuit 100c_1 is set to the active state. The switches SEL11 through SEL13 are set to the states shown in FIG. 18, and accordingly, the audio signal processing circuit 100e is set to the second state. That is to say, an audio signal is transmitted through a transmission path from the input port Pi to the output port Po via the first selector SEL11, the filter 50, the second selector SEL12, the third selector SEL13, and the third soft switch circuit SSW3, in this order.

Step 2: In the period in which the first channel is in the active state, the states of the selectors SEL14 through 16, the frequency properties of the filter 50, and the gain (attenuation rate) of the variable gain amplifier 52, which are included in the second channel audio signal processing circuit 100c_2, are switched to states that correspond to the first state (state shown in FIG. 18), which is the target state.

Step 3: Subsequently, the input side of the third soft switch circuit SSW3 is softly switched from the first input terminal to the second input terminal. By performing this processing, the state in which the first channel is in the active state is softly switched to the state in which the second channel is in the active state. Thus, the state can be seamlessly switched from the second state to the first state.

By performing the same processing as that in Steps 1 through S3, such an arrangement also provides other soft switching operations for switching the state from the first state to the second state, from the first state to the first state, and from the second state to the second state.

Fourth Embodiment

Description has been made in the third embodiment regarding an arrangement which is capable of switching the sequencing of the single variable gain amplifier 52 and the single filter 50 as desired. On the other hand, a fourth embodiment has a configuration in which two variable gain amplifiers 52b and 53 are respectively arranged as an upstream component and a downstream component of a filter 50.

Figure 19:
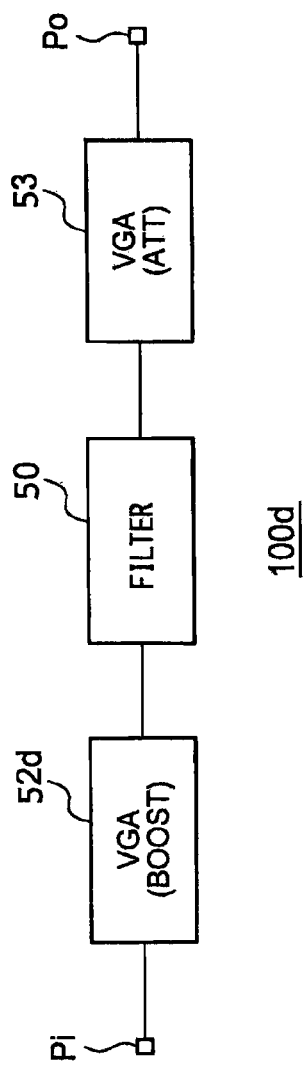
FIG. 19 is a circuit diagram which shows a configuration of an audio signal processing circuit according to a fourth embodiment.

FIG. 19 is a circuit diagram which shows a configuration of an audio signal processing circuit 100d according to the fourth embodiment. The first variable gain amplifier 52b is arranged as a component upstream of the filter 50. The first variable gain amplifier 52b in the active state amplifies, with a gain set beforehand, an audio signal input via the input port Pi. The second variable gain amplifier 53 is arranged as a component downstream of the filter 50. The second variable gain amplifier 53 in the active state attenuates the output signal of the filter 50 with a gain (attenuation rate) set beforehand.

The first variable gain amplifier 52d and the second variable gain amplifier 53 may be set to the active state in a complementary manner. In the non-active state, the first variable gain amplifier 52b and the second variable gain amplifier 53 are each bypassed, or the gain (attenuation rate) of each variable gain amplifier is set to 1.

The first variable gain amplifier 52d and the second variable gain amplifier 53 may be set to the active state at the same time. In this case, such an arrangement amplifies or attenuates an audio signal with a gain obtained by calculating the product of the gain of the first variable gain amplifier 52d and the attenuation rate of the second variable gain amplifier 53, i.e., with a combined gain (total gain).

With the audio signal processing circuit 100d shown in FIG. 19, the first variable gain amplifier 52d is set to the active state, and the second variable gain amplifier 53 is set to the non-active state, thereby providing the first state in which the input port Pi, the variable gain amplifier 52d, the filter 50, and the output port Po are connected in this order. Furthermore, by switching the first variable gain amplifier 52d to the non-active state and switching the second variable gain amplifier to the active state, such an arrangement provides the second state in which the input port Pi, the filter 50, the second variable gain amplifier 53, and the output port Po are connected in this order.

With the audio signal processing circuit 100d shown in FIG. 19, the noise that occurs at the filter 50 can be reduced by means of the second variable gain amplifier 53, or, conversely, the noise that occurs at the variable gain amplifier 52d can be cut by means of the filter 50, in the same way as with the third embodiment. Thus, by optimizing the combination of the gains (attenuation rates) of the first variable gain amplifier 52d and the second variable gain amplifier 53 according to the processing to be performed on the audio signal, such an arrangement is capable of reducing noise.

Figure 20:
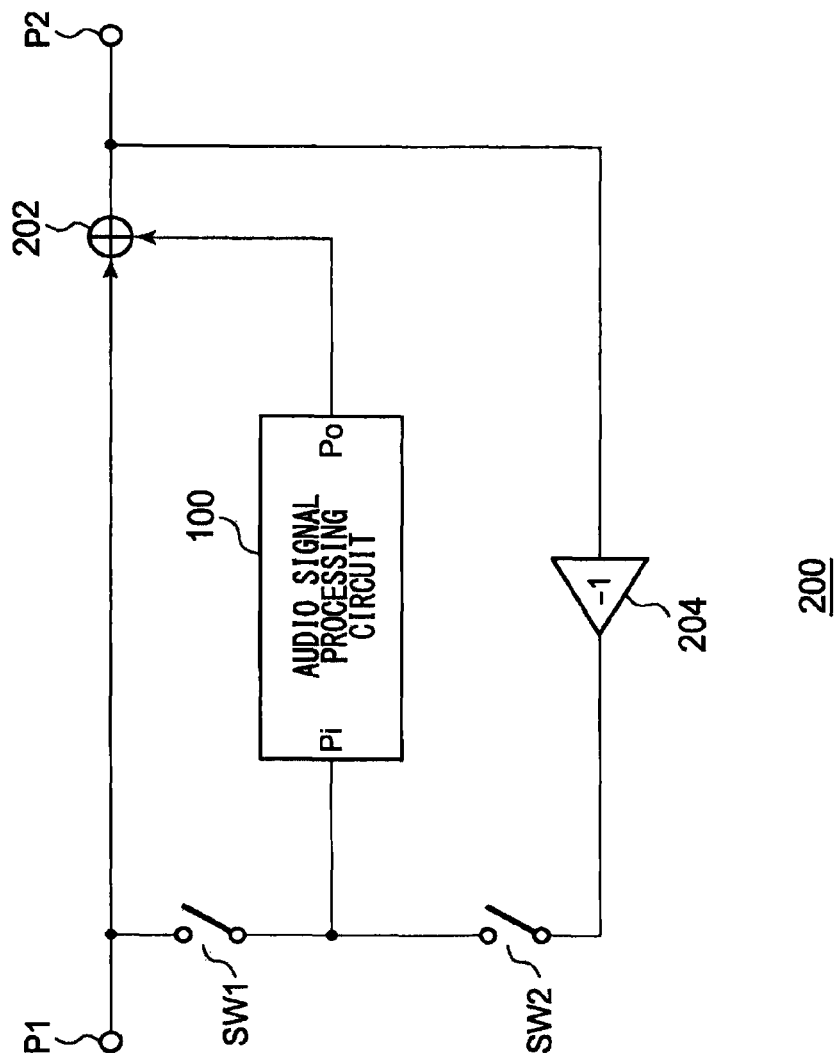
FIG. 20 is a block diagram which shows a configuration of a tone control circuit including the audio signal processing circuit according to the third embodiment or the fourth embodiment.

Lastly, description will be made regarding a suitable application of the audio signal processing circuit according to any one of the above-described embodiments. FIG. 20 is a block diagram which shows a configuration of a tone control circuit including an audio signal processing circuit according to the third or fourth embodiment.

The tone control circuit 200 performs frequency band correction of the audio signal input via the first port P1, and outputs the audio signal thus corrected via the second port P2. The tone control circuit 200 includes an audio signal processing circuit 100 described with reference to FIGS. 9 to 19, a first switch SW1, a second switch SW2, a mixer circuit 202, and an inverting amplifier 204.

The first switch SW1 is provided between the input port Pi of the audio signal processing circuit 100 and the first port P1. The mixer circuit 202 mixes the signal input via the first port P1 and the signal output via the output port Po of the audio signal processing circuit 100, and outputs the signal thus mixed to the second port P2. The inverting amplifier 204 inverts the signal output via the second port P2. The second switch SW2 is provided between the output terminal of the inverting amplifier 204 and the input port Pi of the audio signal processing circuit 100.

The tone control circuit 200 is capable of switching the function thereof between the boost circuit function and the cut circuit function. When the tone control circuit 200 functions as a boost circuit, the first switch SW1 is switched on, the second switch SW2 is switched off, and the matrix switch circuit 54 included in the audio signal processing circuit 100 is set to the first state φ1. On the other hand, when the tone control circuit 200 functions to a cut circuit, the second switch SW2 is switched on, the first switch SW1 is switched off, and the matrix switch circuit 54 is set to the second state φ2.

With the tone control circuit 200, the state of the audio signal processing circuit 100 is switched according to the mode of the signal processing (boost circuit mode or cut circuit mode), thereby suitably reducing noise. Furthermore, the audio signal processing circuit 100 which is capable of performing the soft switching operation is employed, thereby preventing noise from occurring when the function mode is switched between the boost circuit mode and the cut circuit mode.

It should be noted that the application of the audio signal processing circuit 100 is not restricted to the tone control circuit 200. Also, the audio signal processing circuit 100 can be applied to various circuits having a configuration in which a filter and a variable gain amplifier is connected in series.

While the preferred embodiments of the present invention have been described using specific terms, such description is for illustrative purposes only, and it is to be understood that changes and variations may be made without departing from the spirit or scope of the appended claims.

What is claimed is:

1. An input selector comprising:
   a first input port and a second input port configured to receive a first input signal and a second input signal, respectively;
   a first resistor arranged such that one terminal thereof is connected to the first input port;
   a second resistor arranged such that one terminal thereof is connected to the second input port, and such that a first reference voltage is applied to the other terminal thereof;
   a first selector configured to receive the second input signal and a second reference voltage, and to select one from among the input signals thus received;
   a first buffer configured to receive an output signal of the first selector, and to output the signal thus received to the other terminal of the first resistor; and
   an output circuit having a first input terminal, a second input terminal, and an output terminal, and configured to be capable of switching the state between at least one state selected from among a state in which a signal received via the first input terminal is output and a state in which a signal received via the second input terminal is output, and a state in which a signal is output according to the difference between the signal received via the first input terminal and the signal received via the second input terminal,
   wherein the output circuit receives the first input signal via the first input terminal, and receives the second input signal via the second input terminal.

2. An input selector according to claim 1, further comprising:
   a third input port configured to receive a third input signal;
   a third resistor arranged such that one terminal thereof is connected to the third input port; and
   a second selector configured to receive the first input signal and the third input signal, and to select one from among the input signals thus received,
   wherein the output circuit receives an output signal of the second selector via the first input terminal thereof, and receives the second input signal via the second input terminal thereof.

3. An input selector according to claim 2, further comprising a third selector arranged on a path provided from the second input port to the second input terminal of the output circuit, and configured to receive the second input signal via one input terminal among the plurality input terminals thereof and select the second input signal,
   wherein the output circuit receives, via the second terminal thereof, the second input signal transmitted via the third selector.

4. An input selector according to claim 2, further comprising:
   a fourth input port configured to receive a fourth input signal;
   a fourth resistor arranged such that one terminal thereof is connected to the fourth input port, and such that a third reference voltage is applied to the other terminal thereof; and
   a third selector arranged on a path provided from the second input port to the second input terminal of the output circuit, and configured to receive the second input signal and the fourth input signal via a second input terminal thereof,
   wherein the first selector receives the fourth input signal, in addition to the second input signal and the second reference voltage.

5. An input selector according to claim 4, wherein the first selector receives a signal that corresponds to the output signal of the third selector, instead of the second input signal and the fourth input signal.

6. An input selector according to claim 1, wherein the output circuit comprises:
   an operational amplifier having two input terminals and an output terminal;
   a first output resistor arranged such that one terminal thereof is connected to one input terminal of the operational amplifier, and such that a signal that corresponds to the signal input via the first input terminal of the output circuit is received via the other terminal thereof;
   a second output resistor arranged such that one terminal thereof is connected to the aforementioned one input terminal of the operational amplifier, and such that a fourth reference voltage is applied to the other terminal thereof;
   a third output resistor arranged such that one terminal thereof is connected to the other terminal of the operational amplifier, and such that a signal that corresponds to the signal input via the second input terminal of the output circuit is received via the other terminal thereof;
   a fourth output resistor arranged such that one terminal thereof is connected to the other input terminal of the operational amplifier, and such that the other terminal thereof is connected to the output terminal of the operational amplifier; and
   a fourth selector configured to receive an output signal of the operational amplifier, a signal that corresponds to the signal input via the first input terminal of the output circuit, and a signal that corresponds to the signal input via the second input terminal of the output circuit, and to select one signal from among the input signals thus received.

7. An input selector according to claim 1, wherein the output circuit comprises:
   an operational amplifier having two input terminals and an output terminal;
   a fifth selector having two input terminals, and arranged such that an output terminal thereof is connected to one input terminal of the operational amplifier;
   a sixth selector having two input terminals, and arranged such that one terminal thereof; i.e., a first input terminal thereof is connected to the output terminal of the operational amplifier, and such that the output terminal thereof is connected to the other input terminal of the operational amplifier;
   a first output resistor arranged such that one terminal thereof is connected to the first input terminal of the fifth selector, and such that a signal that corresponds to the signal input via the first input terminal of the output circuit is received via the other terminal thereof;
   a second output resistor arranged such that one terminal thereof is connected to the first input terminal of the fifth selector, and such that a fourth reference voltage is applied to the other terminal thereof;
   a third output resistor arranged such that one terminal thereof is connected to a second input terminal of the sixth selector, and such that a signal that corresponds to the signal input via the second input terminal of the output circuit is received via the other terminal thereof; and
   a fourth output resistor arranged such that one terminal thereof is connected to the second input terminal of the sixth selector, and such that the other terminal thereof is connected to the output terminal of the operational amplifier.

8. An input selector according to claim 6, wherein the output circuit further comprises:
a second buffer arranged on a path provided from the first input terminal of the output circuit to the aforementioned other terminal of the first output resistor; and
a third buffer arranged on a path provided from the second input terminal of the output circuit to the aforementioned other terminal of the third output resistor.

9. An input selector comprising two sets of the input selectors according to claim 1.

10. An input selector according to claim 1, wherein the first input signal and the second input signal are analog audio signals.

11. An input selector comprising:
two input selectors, wherein each of the input selectors comprises:
first input port and a second input port configured to receive a first input signal and a second input signal, respectively;
a first resistor arranged such that one terminal thereof is connected to the first input port;
a second resistor arranged such that one terminal thereof is connected to the second input port, and such that a first reference voltage is applied to the other terminal thereof;
a first selector configured to receive the second input signal and a second reference voltage, and to select one from among the input signals thus received;
a first buffer configured to receive an output signal of the first selector, and to output the signal thus received to the other terminal of the first resistor;
an output circuit having a first input terminal, a second input terminal, and an output terminal, and configured to be capable of switching the state between at least one state selected from among a state in which a signal received via the first input terminal is output and a state in which a signal received via the second input terminal is output, and a state in which a signal is output according to the difference between the signal received via the first input terminal and the signal received via the second input terminal;
a third input port configured to receive a third input signal;
a third resistor arranged such that one terminal thereof is connected to the third input port;
a second selector configured to receive the first input signal and the third input signal, and to select one from among the input signals thus received;
a third selector arranged on a path provided from the second input port to the second input terminal of the output circuit, and configured to receive the second input signal via an input terminal thereof;
a fourth input port configured to receive a fourth input signal; and
a fourth resistor arranged such that one terminal thereof is connected to the fourth input port, and such that a third reference voltage is applied to the other terminal thereof;
wherein the output circuit receives the first input signal via the first input terminal, and receives the second input signal via the second input terminal;
wherein the output circuit receives, via the second terminal thereof, the second input signal transmitted via the third selector;
wherein the first selector receives the fourth input signal, in addition to the second input signal and the second reference voltage;
and wherein the third selector receives the fourth input signal, in addition to the second input signal;
wherein the first selector on one input selector side receives, as an input signal, the output signal of the first selector on the other input selector side, in addition to the second input signal, the second reference voltage, and the fourth input signal.

\* \* \* \* \*